(12) United States Patent
Currie et al.

(10) Patent No.: US 7,217,603 B2
(45) Date of Patent: May 15, 2007

(54) METHODS OF FORMING REACTED CONDUCTIVE GATE ELECTRODES

(75) Inventors: Matthew T. Currie, Brookline, MA (US); Richard Hammond, Canton Cardiff (GB)

(73) Assignee: AmberWave Systems Corporation, Salem, NH (US)

( * ) Notice: Subject to any disclaimer, the term of this patent is extended or adjusted under 35 U.S.C. 154(b) by 0 days.

(21) Appl. No.: 11/073,976

(22) Filed: Mar. 7, 2005

(65) Prior Publication Data
US 2005/0156210 A1    Jul. 21, 2005

Related U.S. Application Data

(62) Division of application No. 10/179,079, filed on Jun. 25, 2002, now Pat. No. 6,982,474.

(51) Int. Cl.
*H01L 21/00* (2006.01)
(52) U.S. Cl. .................................. 438/149; 438/157
(58) Field of Classification Search ................ 438/149, 438/172, 199, 582, 592, 682, 157, 162
See application file for complete search history.

(56) References Cited

U.S. PATENT DOCUMENTS

| | | | |
|---|---|---|---|
| 4,010,045 A | 3/1977 | Ruehrwein | |
| 4,522,662 A | 6/1985 | Bradbury et al. | |
| 4,710,788 A | 12/1987 | Dambkes et al. | |
| 4,717,681 A | 1/1988 | Curran | |
| 4,749,441 A | 6/1988 | Christenson et al. | |
| 4,755,478 A | 7/1988 | Abernathey et al. | |
| 4,786,615 A | 11/1988 | Liaw et al. | |
| 4,803,539 A | 2/1989 | Psaras et al. | |
| 4,963,506 A | 10/1990 | Liaw et al. | |
| 4,969,031 A | 11/1990 | Kobayashi et al. | |
| 4,987,462 A | 1/1991 | Kim et al. | |
| 4,990,979 A | 2/1991 | Otto | |
| 4,997,776 A | 3/1991 | Harame et al. | |

(Continued)

FOREIGN PATENT DOCUMENTS

DE    41 01 167 A1    7/1992

(Continued)

OTHER PUBLICATIONS

Aldrich, et al., "Stability of C54 Titanium Germanosilicide on a Silicon-Geranium Alloy Substrate," *Journal of Applied Physics*, vol. 77, No. 10 (1995) 5107-5114.

(Continued)

*Primary Examiner*—Howard Weiss
*Assistant Examiner*—(Vikki) Hoa B. Trinh
(74) *Attorney, Agent, or Firm*—Goodwin Procter LLP

(57) ABSTRACT

A semiconductor device and a method for fabricating a semiconductor device involve a semiconductor layer that includes a first material and a second material. The first and second materials can be silicon and germanium. A contact of the device has a portion proximal to the semiconductor layer and a portion distal to the semiconductor layer. The distal portion includes the first material and the second material. A metal layer formed adjacent to the relaxed semiconductor layer and adjacent to the distal portion of the contact is simultaneously reacted with the relaxed semiconductor layer and with the distal portion of the contact to provide metallic contact material.

42 Claims, 6 Drawing Sheets

U.S. PATENT DOCUMENTS

| | | |
|---|---|---|
| 5,013,681 A | 5/1991 | Godbey et al. |
| 5,034,348 A | 7/1991 | Hartswick et al. |
| 5,089,872 A | 2/1992 | Ozturk et al. |
| 5,091,767 A | 2/1992 | Bean et al. |
| 5,108,946 A | 4/1992 | Zdebel et al. |
| 5,155,571 A | 10/1992 | Wang et al. |
| 5,166,084 A | 11/1992 | Pfiester |
| 5,177,583 A | 1/1993 | Endo et al. |
| 5,198,689 A | 3/1993 | Fujioka |
| 5,202,284 A | 4/1993 | Kamins et al. |
| 5,207,864 A | 5/1993 | Bhat et al. |
| 5,208,182 A | 5/1993 | Narayan et al. |
| 5,212,110 A | 5/1993 | Pfiester et al. |
| 5,212,112 A | 5/1993 | Lynch |
| 5,217,923 A | 6/1993 | Suguro |
| 5,221,413 A | 6/1993 | Brasen et al. |
| 5,225,703 A | 7/1993 | Nakatani et al. |
| 5,240,876 A | 8/1993 | Gaul et al. |
| 5,241,197 A | 8/1993 | Murakami et al. |
| 5,242,847 A | 9/1993 | Ozturk et al. |
| 5,243,207 A | 9/1993 | Plumton et al. |
| 5,250,445 A | 10/1993 | Bean et al. |
| 5,285,086 A | 2/1994 | Fitzgerald |
| 5,291,439 A | 3/1994 | Kauffmann et al. |
| 5,294,564 A | 3/1994 | Karapiperis et al. |
| 5,298,452 A | 3/1994 | Meyerson |
| 5,304,834 A | 4/1994 | Lynch |
| 5,310,451 A | 5/1994 | Tejwani et al. |
| 5,316,958 A | 5/1994 | Meyerson |
| 5,334,861 A | 8/1994 | Pfiester et al. |
| 5,336,903 A | 8/1994 | Ozturk et al. |
| 5,346,840 A | 9/1994 | Fujioka |
| 5,346,848 A | 9/1994 | Grupen-Shemansky |
| 5,374,564 A | 12/1994 | Bruel |
| 5,399,522 A | 3/1995 | Ohori |
| 5,413,679 A | 5/1995 | Godbey |
| 5,424,243 A | 6/1995 | Takasaki |
| 5,426,069 A | 6/1995 | Selvakumar et al. |
| 5,426,316 A | 6/1995 | Mohammad |
| 5,442,205 A | 8/1995 | Brasen et al. |
| 5,461,243 A | 10/1995 | Ek et al. |
| 5,461,250 A | 10/1995 | Burghartz et al. |
| 5,462,883 A | 10/1995 | Dennard et al. |
| 5,476,813 A | 12/1995 | Naruse |
| 5,479,033 A | 12/1995 | Baca et al. |
| 5,484,664 A | 1/1996 | Kitaahara et al. |
| 5,496,750 A | 3/1996 | Moslehi |
| 5,496,771 A | 3/1996 | Cronin et al. |
| 5,523,243 A | 6/1996 | Mohammad |
| 5,523,592 A | 6/1996 | Nakagawa et al. |
| 5,534,713 A | 7/1996 | Ismail et al. |
| 5,536,361 A | 7/1996 | Kondo et al. |
| 5,540,785 A | 7/1996 | Dennard et al. |
| 5,571,373 A | 11/1996 | Krishna et al. |
| 5,572,043 A | 11/1996 | Shimizu et al. |
| 5,596,527 A | 1/1997 | Tomioka et al. |
| 5,617,351 A | 4/1997 | Bertin et al. |
| 5,630,905 A | 5/1997 | Lynch et al. |
| 5,633,202 A | 5/1997 | Brigham et al. |
| 5,659,187 A | 8/1997 | Legoues et al. |
| 5,659,194 A | 8/1997 | Iwamatsu et al. |
| 5,683,934 A | 11/1997 | Candelaria |
| 5,698,869 A | 12/1997 | Yoshimi et al. |
| 5,710,450 A | 1/1998 | Chau et al. |
| 5,714,777 A | 2/1998 | Ismail et al. |
| 5,728,623 A | 3/1998 | Mori |
| 5,739,567 A | 4/1998 | Wong |
| 5,759,898 A | 6/1998 | Ek et al. |
| 5,777,347 A | 7/1998 | Bartelink |
| 5,786,612 A | 7/1998 | Otani et al. |
| 5,786,614 A | 7/1998 | Chuang et al. |
| 5,792,679 A | 8/1998 | Nakato |
| 5,808,344 A | 9/1998 | Ismail et al. |
| 5,821,577 A | 10/1998 | Crabbe' et al. |
| 5,844,260 A | 12/1998 | Ohori |
| 5,847,419 A | 12/1998 | Imai et al. |
| 5,869,359 A | 2/1999 | Prabhakar |
| 5,876,796 A | 3/1999 | Regolini |
| 5,877,070 A | 3/1999 | Goesele et al. |
| 5,877,535 A | 3/1999 | Matsumoto |
| 5,891,769 A | 4/1999 | Liaw et al. |
| 5,906,708 A | 5/1999 | Robinson et al. |
| 5,906,951 A | 5/1999 | Chu et al. |
| 5,912,479 A | 6/1999 | Mori et al. |
| 5,933,741 A | 8/1999 | Tseng |
| 5,943,560 A | 8/1999 | Chang et al. |
| 5,963,817 A | 10/1999 | Chu et al. |
| 5,966,622 A | 10/1999 | Levine et al. |
| 5,976,939 A | 11/1999 | Thompson et al. |
| 5,998,807 A | 12/1999 | Lustig et al. |
| 6,008,111 A | 12/1999 | Fushida et al. |
| 6,013,134 A | 1/2000 | Chu et al. |
| 6,030,887 A | 2/2000 | Desai et al. |
| 6,030,889 A | 2/2000 | Aulicino et al. |
| 6,033,974 A | 3/2000 | Henley et al. |
| 6,033,995 A | 3/2000 | Muller |
| 6,058,044 A | 5/2000 | Sugiura et al. |
| 6,059,895 A | 5/2000 | Chu et al. |
| 6,066,563 A | 5/2000 | Nagashima |
| 6,074,919 A | 6/2000 | Gardner et al. |
| 6,096,590 A | 8/2000 | Chan et al. |
| 6,096,647 A | 8/2000 | Yang et al. |
| 6,103,559 A | 8/2000 | Gardner et al. |
| 6,107,653 A | 8/2000 | Fitzgerald |
| 6,111,267 A | 8/2000 | Fischer et al. |
| 6,117,750 A | 9/2000 | Bensahel et al. |
| 6,121,100 A | 9/2000 | Andideh et al. |
| 6,130,453 A | 10/2000 | Mei et al. |
| 6,132,806 A | 10/2000 | Dutartre |
| 6,133,124 A | 10/2000 | Horstmann et al. |
| 6,133,799 A | 10/2000 | Favors et al. |
| 6,140,687 A | 10/2000 | Shimomura et al. |
| 6,143,636 A | 11/2000 | Forbes et al. |
| 6,153,495 A | 11/2000 | Kub et al. |
| 6,154,475 A | 11/2000 | Soref et al. |
| 6,159,852 A | 12/2000 | Nuttall et al. |
| 6,159,856 A | 12/2000 | Nagano |
| 6,160,303 A | 12/2000 | Fattaruso |
| 6,162,688 A | 12/2000 | Gardner et al. |
| 6,184,111 B1 | 2/2001 | Henley et al. |
| 6,187,657 B1 | 2/2001 | Xiang et al. |
| 6,191,007 B1 | 2/2001 | Matsui et al. |
| 6,191,432 B1 | 2/2001 | Sugiyama et al. |
| 6,194,722 B1 | 2/2001 | Fiorini et al. |
| 6,204,529 B1 | 3/2001 | Lung et al. |
| 6,207,977 B1 | 3/2001 | Augusto |
| 6,210,988 B1 | 4/2001 | Howe et al. |
| 6,214,679 B1 | 4/2001 | Murthy et al. |
| 6,218,677 B1 | 4/2001 | Broekaert |
| 6,228,694 B1 | 5/2001 | Doyle et al. |
| 6,232,138 B1 | 5/2001 | Fitzgerald et al. |
| 6,235,567 B1 | 5/2001 | Huang |
| 6,235,568 B1 | 5/2001 | Murthy et al. |
| 6,235,575 B1 | 5/2001 | Kasai et al. |
| 6,242,324 B1 | 6/2001 | Kub et al. |
| 6,242,327 B1 | 6/2001 | Yokoyama et al. |
| 6,246,077 B1 | 6/2001 | Kobayashi et al. |
| 6,249,022 B1 | 6/2001 | Lin et al. |
| 6,251,755 B1 | 6/2001 | Furukawa et al. |
| 6,251,780 B1 | 6/2001 | Sohn et al. |
| 6,261,929 B1 | 7/2001 | Gehrke et al. |
| 6,266,278 B1 | 7/2001 | Harari et al. |
| 6,268,257 B1 | 7/2001 | Wieczorek et al. |
| 6,271,551 B1 | 8/2001 | Schmitz et al. |

| Patent | Date | Inventor |
|---|---|---|
| 6,271,726 B1 | 8/2001 | Fransis et al. |
| 6,281,532 B1 | 8/2001 | Doyle et al. |
| 6,291,321 B1 | 9/2001 | Fitzgerald |
| 6,294,448 B1 | 9/2001 | Chang et al. |
| 6,306,698 B1 | 10/2001 | Wieczorek et al. |
| 6,313,016 B1 | 11/2001 | Kibbel et al. |
| 6,313,486 B1 | 11/2001 | Kencke et al. |
| 6,315,384 B1 | 11/2001 | Ramaswami et al. |
| 6,316,301 B1 | 11/2001 | Kant |
| 6,316,357 B1 | 11/2001 | Lin et al. |
| 6,319,799 B1 | 11/2001 | Ouyang et al. |
| 6,319,805 B1 | 11/2001 | Iwamatsu et al. |
| 6,323,108 B1 | 11/2001 | Kub et al. |
| 6,326,281 B1 | 12/2001 | Violette et al. |
| 6,326,664 B1 | 12/2001 | Chau et al. |
| 6,329,063 B2 | 12/2001 | Lo et al. |
| 6,335,546 B1 | 1/2002 | Tsuda et al. |
| 6,339,232 B1 | 1/2002 | Takagi |
| 6,342,421 B1 | 1/2002 | Mitani et al. |
| 6,344,375 B1 | 2/2002 | Orita et al. |
| 6,350,311 B1 | 2/2002 | Chin et al. |
| 6,350,993 B1 | 2/2002 | Chu et al. |
| 6,352,909 B1 | 3/2002 | Usenko |
| 6,362,071 B1 | 3/2002 | Nguyen et al. |
| 6,368,733 B1 | 4/2002 | Nishinaga |
| 6,368,927 B1 | 4/2002 | Lee et al. |
| 6,369,438 B1 | 4/2002 | Sugiyama et al. |
| 6,372,356 B1 | 4/2002 | Thornton et al. |
| 6,372,593 B1 | 4/2002 | Hattori et al. |
| 6,376,318 B1 | 4/2002 | Lee et al. |
| 6,380,008 B2 | 4/2002 | Kwok et al. |
| 6,391,798 B1 | 5/2002 | DeFelice et al. |
| 6,399,970 B2 | 6/2002 | Kubo et al. |
| 6,403,975 B1 | 6/2002 | Brunner et al. |
| 6,406,973 B1 | 6/2002 | Lee et al. |
| 6,406,986 B1 | 6/2002 | Yu |
| 6,407,406 B1 | 6/2002 | Tezuka |
| 6,410,371 B1 | 6/2002 | Yu et al. |
| 6,420,937 B1 | 7/2002 | Akatsuka et al. |
| 6,425,951 B1 | 7/2002 | Chu et al. |
| 6,429,061 B1 | 8/2002 | Rim |
| 6,461,960 B2 | 10/2002 | Lee |
| 6,486,520 B2 | 11/2002 | Okuno et al. |
| 6,492,216 B1 | 12/2002 | Yeo et al. |
| 6,498,359 B2 | 12/2002 | Schmidt et al. |
| 6,503,833 B1 | 1/2003 | Ajmera et al. |
| 6,509,587 B2 | 1/2003 | Sugiyama et al. |
| 6,521,041 B2 | 2/2003 | Wu et al. |
| 6,521,508 B1 | 2/2003 | Cheong et al. |
| 6,524,935 B1 | 2/2003 | Canaperi et al. |
| 6,555,839 B2 | 4/2003 | Fitzgerald |
| 6,555,880 B2 | 4/2003 | Cabral et al. |
| 6,562,703 B1 | 5/2003 | Maa et al. |
| 6,563,152 B2 | 5/2003 | Roberds et al. |
| 6,566,718 B2 | 5/2003 | Wieczorek et al. |
| 6,573,126 B2 | 6/2003 | Cheng et al. |
| 6,573,160 B2 | 6/2003 | Taylor, Jr. et al. |
| 6,583,015 B2 | 6/2003 | Fitzgerald et al. |
| 6,591,321 B1 | 7/2003 | Arimilli et al. |
| 6,593,191 B2 | 7/2003 | Fitzgerald |
| 6,593,641 B1 | 7/2003 | Fitzergald |
| 6,597,016 B1 | 7/2003 | Yuki et al. |
| 6,602,613 B1 | 8/2003 | Fitzgerald |
| 6,603,156 B2 | 8/2003 | Rim |
| 6,605,498 B1 | 8/2003 | Murthy et al. |
| 6,607,948 B1 | 8/2003 | Sugiyama et al. |
| 6,621,131 B2 | 9/2003 | Murthy et al. |
| 6,646,322 B2 | 11/2003 | Fitzgerald |
| 6,649,480 B2 | 11/2003 | Fitzgerald et al. |
| 6,657,223 B1 | 12/2003 | Wang et al. |
| 6,674,150 B2 | 1/2004 | Takagi et al. |
| 6,677,192 B1 | 1/2004 | Fitzgerald |
| 6,682,965 B1 | 1/2004 | Noguchi et al. |
| 6,686,617 B2 | 2/2004 | Agnello et al. |
| 6,690,043 B1 | 2/2004 | Usuda et al. |
| 6,699,765 B1 | 3/2004 | Shideler et al. |
| 6,703,144 B2 | 3/2004 | Fitzgerald |
| 6,703,271 B2 | 3/2004 | Yeo et al. |
| 6,703,648 B1 | 3/2004 | Xiang et al. |
| 6,703,688 B1 | 3/2004 | Fitzergald |
| 6,709,903 B2 | 3/2004 | Christiansen |
| 6,709,929 B2 | 3/2004 | Zhang et al. |
| 6,713,326 B2 | 3/2004 | Cheng et al. |
| 6,723,661 B2 | 4/2004 | Fitzergald |
| 6,724,008 B2 | 4/2004 | Fitzergald |
| 6,724,019 B2 | 4/2004 | Oda et al. |
| 6,730,551 B2 | 5/2004 | Lee et al. |
| 6,737,670 B2 | 5/2004 | Cheng et al. |
| 6,743,651 B2 | 6/2004 | Chu et al. |
| 6,743,684 B2 | 6/2004 | Liu |
| 6,750,130 B1 | 6/2004 | Fitzgerald |
| 6,787,864 B2 | 9/2004 | Paton et al. |
| 6,797,571 B2 | 9/2004 | Nagaoka et al. |
| 6,812,086 B2 | 11/2004 | Murthy et al. |
| 6,818,537 B2 | 11/2004 | Cheong et al. |
| 6,818,938 B1 | 11/2004 | Naem et al. |
| 6,828,632 B2 | 12/2004 | Bhattacharyya |
| 6,830,976 B2 | 12/2004 | Fitzgerald |
| 6,855,649 B2 | 2/2005 | Christiansen et al. |
| 6,855,990 B2 | 2/2005 | Yeo et al. |
| 6,861,318 B2 | 3/2005 | Murthy et al. |
| 6,876,053 B1 | 4/2005 | Ma et al. |
| 6,881,360 B2 | 4/2005 | Stange et al. |
| 6,885,084 B2 | 4/2005 | Murthy et al. |
| 6,887,762 B1 | 5/2005 | Murthy et al. |
| 6,887,773 B2 | 5/2005 | Gunn, III et al. |
| 6,900,103 B2 | 5/2005 | Fitzgerald |
| 6,909,186 B2 | 6/2005 | Chu |
| 6,936,509 B2 | 8/2005 | Coolbaugh et al. |
| 6,953,972 B2 | 10/2005 | Yeo et al. |
| 6,974,733 B2 | 12/2005 | Boyanov et al. |
| 6,982,433 B2 | 1/2006 | Hoffman et al. |
| 6,992,355 B2 | 1/2006 | Mouli |
| 6,995,430 B2 | 2/2006 | Langdo et al. |
| 2001/0001724 A1 | 5/2001 | Kwok et al. |
| 2001/0003269 A1 | 6/2001 | Wu et al. |
| 2001/0003364 A1 | 6/2001 | Sugawara et al. |
| 2001/0009303 A1 | 7/2001 | Tang et al. |
| 2001/0031535 A1 | 10/2001 | Agnello et al. |
| 2001/0045604 A1 | 11/2001 | Oda et al. |
| 2002/0001948 A1 | 1/2002 | Lee |
| 2002/0019127 A1 | 2/2002 | Givens |
| 2002/0024395 A1 | 2/2002 | Akatsuka et al. |
| 2002/0043660 A1 | 4/2002 | Yamazaki et al. |
| 2002/0048910 A1 | 4/2002 | Taylor, Jr. et al. |
| 2002/0052084 A1 | 5/2002 | Fitzgerald |
| 2002/0056879 A1 | 5/2002 | Wieczorek et al. |
| 2002/0063292 A1 | 5/2002 | Armstrong et al. |
| 2002/0068393 A1 | 6/2002 | Fitzgerald et al. |
| 2002/0072130 A1 | 6/2002 | Cheng et al. |
| 2002/0084000 A1 | 7/2002 | Fitzgerald |
| 2002/0096717 A1 | 7/2002 | Chu et al. |
| 2002/0100942 A1 | 8/2002 | Fitzgerald et al. |
| 2002/0123167 A1 | 9/2002 | Fitzgerald |
| 2002/0123182 A1 | 9/2002 | Fitzgerald |
| 2002/0123183 A1 | 9/2002 | Fitzgerald |
| 2002/0123197 A1 | 9/2002 | Fitzgerald et al. |
| 2002/0125471 A1 | 9/2002 | Fitzgerald et al. |
| 2002/0125497 A1 | 9/2002 | Fitzgerald |
| 2002/0140031 A1 | 10/2002 | Rim |
| 2002/0168864 A1 | 11/2002 | Cheng et al. |
| 2002/0190284 A1 | 12/2002 | Murthy et al. |
| 2003/0003679 A1 | 1/2003 | Doyle et al. |
| 2003/0013323 A1 | 1/2003 | Hammond et al. |
| 2003/0025131 A1 | 2/2003 | Lee et al. |
| 2003/0034529 A1 | 2/2003 | Fitzgerald et al. |

| | | | |
|---|---|---|---|
| 2003/0057439 A1 | 3/2003 | Fitzgerald | |
| 2003/0080361 A1 | 5/2003 | Murthy et al. | |
| 2003/0089901 A1 | 5/2003 | Fitzgerald | |
| 2003/0102498 A1 | 6/2003 | Braithwaite et al. | |
| 2003/0113971 A1 | 6/2003 | Nagaoka et al. | |
| 2003/0162348 A1 | 8/2003 | Yeo et al. | |
| 2003/0199126 A1 | 10/2003 | Chu et al. | |
| 2003/0203600 A1 | 10/2003 | Chu et al. | |
| 2003/0215990 A1 | 11/2003 | Fitzgerald et al. | |
| 2003/0218189 A1 | 11/2003 | Christiansen | |
| 2003/0227029 A1 | 12/2003 | Lochtefeld et al. | |
| 2003/0227057 A1 | 12/2003 | Lochtefeld et al. | |
| 2004/0005740 A1 | 1/2004 | Lochtefeld et al. | |
| 2004/0007724 A1 | 1/2004 | Murthy et al. | |
| 2004/0014276 A1 | 1/2004 | Murthy et al. | |
| 2004/0014304 A1 | 1/2004 | Bhattacharyya | |
| 2004/0031979 A1 | 2/2004 | Lochtefeld | |
| 2004/0041210 A1 | 3/2004 | Mouli | |
| 2004/0061191 A1 | 4/2004 | Paton et al. | |
| 2004/0070035 A1 | 4/2004 | Murthy et al. | |
| 2004/0075148 A1 | 4/2004 | Kumagai et al. | |
| 2004/0075149 A1 | 4/2004 | Fitzgerald et al. | |
| 2004/0084735 A1 | 5/2004 | Murthy et al. | |
| 2004/0119101 A1 | 6/2004 | Schrom et al. | |
| 2004/0121564 A1 | 6/2004 | Gogoi | |
| 2004/0142545 A1 | 7/2004 | Ngo et al. | |
| 2004/0173815 A1 | 9/2004 | Yeo et al. | |
| 2004/0175893 A1 | 9/2004 | Vatus et al. | |
| 2004/0217430 A1 | 11/2004 | Chu | |
| 2004/0219726 A1 | 11/2004 | Fitzgerald | |
| 2004/0253774 A1 | 12/2004 | Boyanov et al. | |
| 2004/0253776 A1 | 12/2004 | Hoffmann et al. | |
| 2004/0256613 A1 | 12/2004 | Oda et al. | |
| 2004/0262683 A1 | 12/2004 | Bohr et al. | |
| 2005/0009263 A1 | 1/2005 | Yeo et al. | |
| 2005/0042849 A1 | 2/2005 | Currie et al. | |
| 2005/0077511 A1 | 4/2005 | Fitzergald | |
| 2005/0112048 A1 | 5/2005 | Tsakalakos et al. | |
| 2005/0130454 A1 | 6/2005 | Murthy et al. | |
| 2005/0156169 A1 | 7/2005 | Chu | |
| 2005/0156180 A1 | 7/2005 | Zhang et al. | |
| 2005/0156210 A1 | 7/2005 | Currie et al. | |
| 2005/0161711 A1 | 7/2005 | Chu | |
| 2005/0167652 A1 | 8/2005 | Hoffmann et al. | |
| 2005/0176204 A1 | 8/2005 | Langdo et al. | |
| 2005/0250298 A1 | 11/2005 | Bauer | |
| 2005/0277272 A1 | 12/2005 | Singh et al. | |
| 2005/0280026 A1 | 12/2005 | Isaacson et al. | |
| 2005/0280098 A1 | 12/2005 | Shin et al. | |
| 2006/0008958 A1 | 1/2006 | Yeo et al. | |
| 2006/0009001 A1 | 1/2006 | Huang et al. | |
| 2006/0057825 A1 | 3/2006 | Bude et al. | |

FOREIGN PATENT DOCUMENTS

| | | |
|---|---|---|
| EP | 0390661 | 10/1990 |
| EP | 0 514 018 A2 | 11/1992 |
| EP | 0 587 520 B1 | 3/1994 |
| EP | 0 683 522 A2 | 11/1995 |
| EP | 0 828 296 A2 | 3/1998 |
| EP | 0 829 908 A2 | 3/1998 |
| EP | 0 838 858 B1 | 4/1998 |
| EP | 1 020 900 A2 | 7/2000 |
| EP | 1 174 928 A1 | 1/2002 |
| FR | 2 701 599 | 9/1993 |
| GB | 2 342 777 A | 4/2000 |
| JP | 61/141116 | 6/1986 |
| JP | 2/210816 | 8/1990 |
| JP | 30-36717 | 2/1991 |
| JP | 4-74415 | 3/1992 |
| JP | 04-307974 | 10/1992 |
| JP | 5-166724 | 7/1993 |
| JP | 6-177046 | 6/1994 |
| JP | 06-244112 | 9/1994 |
| JP | 6-252046 | 9/1994 |
| JP | 7-94420 | 4/1995 |
| JP | 07-106446 | 4/1995 |
| JP | 7-240372 | 9/1995 |
| JP | 10-270685 | 10/1998 |
| JP | 11-233744 | 8/1999 |
| JP | 2000-021783 | 1/2000 |
| JP | 2000-031491 A | 1/2000 |
| JP | 2001-319935 | 11/2001 |
| JP | 2002-076334 | 3/2002 |
| JP | 2002-164520 | 6/2002 |
| JP | 2002324765 | 8/2002 |
| JP | 2002-289533 | 10/2002 |
| WO | 98/59365 | 12/1998 |
| WO | 99/53539 | 10/1999 |
| WO | 00/48239 | 8/2000 |
| WO | 00/54338 | 9/2000 |
| WO | WO 01/22482 | 3/2001 |
| WO | 01/54202 A1 | 7/2001 |
| WO | 01/93338 A1 | 12/2001 |
| WO | 01/99169 A2 | 12/2001 |
| WO | 02/1544 A2 | 2/2002 |
| WO | WO 02/13262 | 2/2002 |
| WO | 02/27783 A1 | 4/2002 |
| WO | 02/47168 A2 | 6/2002 |
| WO | 02/071488 A1 | 9/2002 |
| WO | 02/071491 A1 | 9/2002 |
| WO | 02/071495 A1 | 9/2002 |
| WO | 02/082514 A1 | 10/2002 |
| WO | 2004/006311 A2 | 1/2004 |
| WO | 2004/006327 A2 | 1/2004 |

OTHER PUBLICATIONS

Antoniadis et al., "SOI Devices and Technology," *SOI devices and technology*, Neuilly sur Seine, France, (1999), pp. 81-87.

Aoyama et al., "Facet formation mechanism of silicon selective epitaxial layer by Si ultrahigh vacuum chemical vapor deposition," *Journal of Crystal Growth*, 136(1994), pp. 349-354.

Arst et al., "Sruface planarity and microstructure of low temperature silicon SEG and ELO," *Journal of Materials Research*, vol. 6, No. 4 (Apr. 1991), pp. 784-791.

Aubry-Fortuna et al., "Phase Formation and Strain Relaxation During Thermal Reaction of Zr and Ti with Strained $Si_{1-x}Ge_xC_y$ Epilayers," *Journal of Applied Physics*, vol. 88, Iss. 3 (2000), 1481-1423.

Augendre, "Elevated Source/Drain by Sacrificial Selective Epitaxy for rHigh Performance Deep Submicron CMOS: Process Window versus Complexity," *IEEE Transactins on Electron Devices*, vol. 47, No. 7 (Jul. 2000), pp. 1484-1491.

Cao et al., "0.18-μm Fully-Depleted Silicon-on-Insulator MOSFET's," *IEEE Electron Device Letters*, vol. 18, No. 6 (Jun. 1997), pp. 251-253.

Chieh et al., "Low-Resistance Bandgap-Engineered $W/Si_{1-x}Ge_x/Si$ Contacts," *IEEE Electron Device Letters*, vol. 17, No. 7 (Jul. 1996) pp. 360-362.

Choi et al., "30nm ultra-thin body SOI MOSFET with selectivity deposited Ge raised S/D," 58th *Device Research Conference* (2000) pp. 23-24.

Choi et al., "Nanoscale Ultrathin Body PMOSFETs With Raised Selective Germanium Source/Drain," *IEEE Electron Device Letters*, vol. 22, No. 9 (Sep. 2001), pp. 447-448.

Detavernier et al., "$CoSi_2$ Nucleation in the Presence of Ge," *Thin Solid Films*, vol. 384, No. 2 (2001), pp. 243-250.

Drowley et al., "Model for facet and sidewall defect formation during selective epitaxial growth of (001) silicon," *Applied Physics Letters*, 52 (7) (Feb. 15, 1988), pp. 546-548.

Eaglesham et al., "Growth Morphology and the Equilibrium Shape: The Role of "Surfactants" in the Ge/Si Island Formation," *Physical Review Letters*, vol. 70, No. 7 (Feb. 15, 1993), pp. 966-969.

Eberhart et al., "Ni/Ag Metallization for SiGe HBTs using a Ni Silicide Contact," *Semiconductor Science and Technology* vol. 16, No. 9, (2001) pp. L47-L49.

Freiman et al., "Kinetics of Processes in the Ti-Si$_{1-x}$Ge$_x$ Systems," *Applied Physics Letters* vol. 69, No. 25 (1996) pp. 3821-3823.

Freiman et al., "Titanium Metallization of Si/Ge Alloys and Superlattices," *Thin Solid Films* vol. 294, No. 1-2 (1997) pp. 217-219.

Gallas et al., "Influence of doping on facet formation at the SiO2/Si interface," *Surface Science*, 440 (1999), pp. 41-48.

Glück et al., "CoSi$_2$ and TiSi$_2$ for Si/SiGe heterodevices," *Thin Solid Films*, vol. 270 (1995) pp. 549-554.

Goulding, "The selective epitaxial growth of silicon," *Materials Science and Engineering*, B17 (1993), pp. 47-67.

Greve et al., "Growth Rate of Doped and Undoped Silicon by Ultra-High Vacuum Chemical Vapor Deposition," *Journal of the Electrochemical Society*, vol. 138, No. 6 (Jun. 1991), pp. 1744-1748.

Hsiao et al., "Advanced Technologies for Optimizied Sub-Quarter-Micrometer SOI CMOS Devices," *IEEE Transactions on Electron Devices*, vol. 45, No. 5 (1998) pp. 1092-1098.

Huang et al., "Electrical and Compositional Properties of Co-Silicided Shallow P$^+$-n Junction Using Si-Capped/Boron-Doped Si$_{1-x}$Ge$_x$ Layer Deposited by UHVCME," *Journal of the Electrochemical Society*, vol. 148, No. 3 (2001) pp. G126-C131.

Huang, et al., "Study on Ge/Si Ration Silidation, and Strain Relaxation of High Temperature Sputtered Co/Si$_{1-x}$Ge$_x$ Structures," *Journal of Applied Physics*, vol. 88, No. 4 (2000) pp. 1831-1837.

Ilderem et al., "Very low pressure chemical vapor deposition process for selective titanium silicide films," *Appl. Phys. Lett.*, vol. 53, No. 8 (Aug. 22, 1988) pp. 687-689.

International Search Report for International Patent Application No. PCT/US03/19528, dated Jun. 20, 2003, 9 pages.

Ishitani et al., "Facet Formation in Selective Silicon Epitaxial Growth," *Japanese Journal of Applied Physics*, vol. 24, No. 10 (Oct. 1985), pp. 1267-1269.

Jang et al., "Phosphorus doping of epitaxial Si and Si1-xGex at very low pressure," *Applied Physics Letters*, 63 (12) (Sep. 20, 1993), pp. 1675-1677.

Jastrzebski, "SOI BY CVD: Epitaxial Lateral Overgrowth (ELO) Process—Review," *Journal of Crystal Growth*, 63 (1983), pp. 493-526.

Jungemann et al., "Full-Band Monte Carlo Simulation of a 0.12 μm-Si-PMOSFET with and without a Strained SiGe-Channel", *IEEE Electron Devices Meeting*, 1998, pp. 897-900.

Kamins et al., "Kinetics of selective epitaxial deposition of Si1-xGex," *Applied Phyics Letters*, 61 (6) (Aug. 10, 1992), pp. 669-671.

Kandel et al., "Surfactant Mediated Crystal Growth of Semiconductors," *Physical review Letters*, vol. 75, No. 14 (Oct. 2, 1995), pp. 2742-2745.

King et al., "A Polycrystalline Si$_{1-x}$Ge$_x$-Gate CMOS Technology", IEEE, Volume, No., 1990, pp. 253-256.

King, "Silicon-Germanium: from Microelectronics to Micromechanics," Presentation to the Thin Film Users Group Meeting, AVS Northern California Chapter, Apr. 17, 2002.

Kitajima et al., "Lattice Defect in Selective Epitaxial Silicon and Laterally Overgrown Regions on SiO2," *Journal of Crystal Growth*, 98 (1989), pp. 264-276.

Ku et al., "High Performance pMOSFETs with Ni(Si$_x$Ge$_{1-x}$)/Poly-Si$_{0.8}$Ge$_{0.2}$ Gate", *IEEE International Electron Devices Meeting*, 1990, pp. 253-256.

Ku et al., "High Performance PMOSFETS with Ni(Si$_{1-x}$Ge$_x$)/Poly-Si$_{0.8}$Ge$_{0.2}$ Gate," *IEEE- 2000 Symposium on BLSI Technology Digest of Technical Papers*, pp. 114-115 (2000).

Kummer et al., "Low energy plasma enhanced chemical vapor deposition," *Materials Science and Engineering*, B89 (2002), pp. 288-295.

Kurosawa et al., "A New Bird's Beak Free Field Isolation Technology for VLSI Devices," *IEDM Technical Digest*, Washington, D.C., Dec. 7-9, 1981, pp. 384-387.

Lai, J.B. et al., "Effects of Composition on the Formation Temperatures and Electrical Resistivities of C54 Titanium Germanosilicide in Ti- Si$_{1-x}$Ge$_x$ Systems," *Journal of Applied Physics*, vol. 86, No. 3 (1999) pp. 1340-1345.

Langdo, "Selective SiGe Nanostructures," Ph.D. Thesis, Massachusetts Institute of Technology, 2001.

Li et al., "Modeling of facet growth on patterned Si substrate in gas source MBE," *Journal of Crystal Growth*, 157 (1995), pp. 185-189.

Lochtefeld, "Toward the End of the MOSFET Roadmap: Investigating Fundamental Transport Limits and Device Architecture Alternatives," Ph.D. Thesis, Massachusetts Institute of Technology, 2001.

Lynch, "Self-Aligned Contact Schemes for Source-Drains in Submicron Devices," *IEDM, Technical Digest* (1987) pp. 354-357.

Maillard-Schaller et al., "Role of the substrate strain in the sheet resistance stability of NiSi deposited on Si(100)," *Journal of Applied Physics*, vol. 85, No. 7 (Apr. 1, 1999) pp. 3614-3618.

Maiti et al., "Strained-Si Heterostructure Field Effect Transistors", *Semiconductor Science Technology*, vol. 13, No. 11, 1998, pp. 1225-1246.

Maiti et al., "Strained-Si Heterostructure Field Effect Transistors," *Semicond. Sci. Technol.*, vol. 13, pp. 1225-1246 (1998).

Mercier et al., "Selective TiSi$_2$ Deposition with no Silicon Substrate Consumption by Rapid Thermal Processing in a LPCVD Reactor," *Journal of Electronic Materials*, vol. 19, No. 3 (1990) pp. 253-258.

Meyer, "Elevated Source/Drain Structures," *The ASM Epitaxy Newsletter of Continuous Improvement*, (Spring 1998) pp. 1-3.

Meyerson et al., "Phosphours-Doped Polycrystalline Silicon via LPCVD," *Journal of the Electrochemical Society*, vol. 131, No. 10 (Oct. 1984), pp. 2366-2368.

Miyano et al., "Facet-Free Si Selective Epitaxial Growth Adaptable to Elevated Source/Drain MOSFETs with Narrow Shallow Trench Isolation," *Japanese Journal of Applied Physics*, vol. 38, Part 1, No. 4B (Apr. 1999), pp. 2419-2423.

Moon et al., "Application of interferometric broadband imaging alignment on an experimental x-ray stepper," *Journal of Vacuum Science and Technology*, B 16(6) (Nov./Dec. 1998), pp. 3631-3636.

O'Neill et al., "Si-Ge Virtual Substrate N-channel Heterojunction MOSFETs", *Semiconductor Science Technology*, vol. 14, No. 9, 1999, pp. 784-789.

Okada et al., "Epitaxial Growth of Heavily B-Doped SiGe Films and Interfacial Reaction of Ti/B-Doped SiGe Bilayer Structure using Rapid Thermal Processing," *Thin Solid Films*, vol. 369, No. 1-2 (2000) pp. 130-133.

Osburn et al., "Low parasitic resistance contacts for scaled ULSI devices," *Thin Solid Films*, 332 (1998) pp. 428-436.

Öztürk et al., "Rapid Thermal Chemical Vapor Deposition of Germanium and germanium/Silicon Alloys on Silicon: New Applications in the Fabrication of MOS Transistors," *Mat. Res. Soc. Symp. Proc.*, vol. 224 (1991) pp. 223-234.

Pfiester et al., "A Self-Aligned Elevated Source/Drain MOSFET," *IEEE Electron Device Letters*, vol. 11, No. 9 (Sep. 1990), pp. 365-367.

Ponomarev et al., "High-Perfomance Deep SubMicron CMOS Technologies with Polycrystalline-SiGe Gates," *IEEE Transactions on Electron Devices*, vol. 47, No. 4, Apr. 2000, pp. 848-855.

Qin, et al., Structure and Thermal Stability of Ni/Si$_{1-x}$Ge$_x$ Contacts for VLSI Applications vol. 36, No. 21 (Oct. 2000) pp. 1819-1821.

Raaijmakers et al., "Enabling technolgies for forming and contacts shallow junctions in Si: HF-vapor cleaning and selective epitaxial growth of Si and SiGe," *Journal of Vacuum Science and Technology*, B17(5) (Sep./Oct. 1999), pp. 2311-2320.

Ren et al., "A Novel Implantation Free Raised Source/Drain MOSFET Process Using Selective Rapid Thermal Chemical Vapor Deposition of In-Situ Boron Doped Si$_x$Ge$_{1-x}$," *Mat. Res. Soc. Symp. Proc.*, vol. 303 (1993) pp. 37-41.

Reynolds et al., "Selective titanium disilicide by low-pressure chemical vapor deposition," *J. Appl. Phys.*, vol. 65, No. 8 (Apr. 15, 1989) pp. 3212-3218.

Robbins et al., "A model for heterogenous growth of Si1-xGex films from hydrides," *Journal of Applied Physics*, 69 (6) (Mar. 15, 1991), pp. 3729-3732.

Rodder et al., "Raised Source/Drain MOSFET with Dual Sidewall Spacers," *IEEE Electron Device Letters*, vol. 12, No. 3 (Mar 1991), pp. 89-91.

Samavedam et al., "Elevated source drain devices using silicon selective epitaxial growth," *Journal of Vacuum Science and Technology*, B 18(3) (May/Jun. 2000), pp. 1244-1250.

Savina et al., "Faceting of a growing crystal surface by surface diffusion," *Physical Review*, E 67, 021606 (2003), pp. 1-16.

Sedgwick et al., "Growth of Facet-Free Selective Silicon Epitaxy at Low Temperature and Atmospheric Pressure," *Journal of the Electrochemical Society*, vol. 138, No. 10 (Oct. 1991), pp. 3042-3047.

Shibata et al., "High Performance Half-Micron PMOSFETs with 0.1UM Shallow $P^+N$ Junction Utilizing Selective Silicon Growth and Rapid Thermal Annealing," *IEDM Technical Digest* (1987) pp. 590-593.

Sidek et al., "Reduction of parasitic bipolar transistor action and punchthrough susceptibility in MOSFETs using Si/Si1-xGex sources and drains," *Electronics Letter*, vol. 32, No. 3 (Feb. 1, 1996), pp. 269-270.

Sun et al., "A Comparative Study of n+/p Junction Formation for Deep Submicron Elevated Source/Drain Metal Oxide Semiconductor Field Effect Transistors," *Journal of the Electrochemical Society*, vol. 144, No. 10 (Oct. 1997), pp. 3659-3664.

Sun et al., "Impact of Epi Facets on Deep Submicron Elevated Source/Drain MOSFET Characteristics," *IEEE Transactions of Electron Devices*, vol. 45, No. 6 (Jun. 1998), pp. 1377-1380.

Sun et al., "The Effect of the Elevated Source/Drain Doping Profile on Performance and Reliability of Deep Submircon MOSFET's," *IEEE Transactions on Electron Devices*, vol. 44, No. 9 (Sep. 1997), pp. 1491-1498.

Tromp et al., "Local Dimer Exchange in Surfactant-Mediated Epitaxial Growth," *Physical Review Letters*, vol. 68, No. 7 (Feb. 17, 1992), pp. 954-957.

Uchino et al., "MOSFETs with Utrashallow Junction and Minimum Drain Area Formed by Using Solid-Phase Diffusion from SiGe," *IEEE Transactions on Electron Devices*, vol. 48, No. 7 (Jul. 2001) pp. 1406-1411.

Uhrberg et al., "Electronic and atomic structure of arsenic terminated Si(100)," *Journal of Vacuum Science and Technology*, A 4 (3) (May/Jun. 1986), pp. 1259-1264.

Violette et al., "Facet-Free Selective Silicon Epitaxy by Reduced-Pressure Chemical Vapor Deposition: Process Evaluation and Impact on Shallow Trench Isolation," *Journal of Electrochemical Society*, 146 (5) (1999), pp. 1895-1902.

Wong et al., "Elevated Source/Drain MOSFET," *IEDM Technical Digest*, 28 (1984), pp. 634-637.

Xiang et al., "Interfacet mass transport and facet evolution in selective epitaxial growth of Si by gas source molecular beam epitaxy," *Journal of Vacuum Science and Technology*, B 14(3) (May/Jun. 1996), pp. 2381-2386.

Yashuda, et al., "Interfacial Reactions of Ti/ and Zr / $Si_{1-x} Ge_x$ / Si Contacts with Rapid Thermal Annealing," *Thin Solid Films*, vol. 373, No. 1-2 (2000) pp. 73-78.

Yasuda et al., "Interfacial Reactions of Ti / and Zr / $Si_{1-x}Ge_x$/ Si Contacts with Rapid Thermal Annealing", *Thin Solid Films*, Volume/No. 373, 2000, pp. 73-78.

Yew, "Growth and Characterization of Low Temperature Silicon Selective Epitaxy," Ph.D. Thesis. MIT, 1990, pp. 1-210.

Yu et al., "Doping reaction of PH3 and B2H6 with Si(100)," *Journal of Applied Physics*, 59 (12) (Jun. 15, 1986), pp. 4032-4037.

Armstrong, "Technology for SiGe Heterostructure-Based CMOS Devices," Ph.D. Thesis. Massachusetts Institute of Technology, Department of Electrical Engineering and Computer Science (Jun. 30, 1999).

Armstrong et al., "Design of Si/SiGe Heterojunction Complementary Metal-Oxide-Semiconductor Transistors," *IEDM Technical Digest* (1995 International Electron Devices Meeting), pp. 761-764.

Augusto et al., "Proposal for a New Process Flow for the Fabrication of Silicon-based Complementary MOD-MOSFETs without ion Implantation," *Thin Solid Films*, vol. 294, No. 1-2, pp. 254-257 (Feb. 15, 1997).

Barradas et al., "RBS analysis of MBE-grown SiGe/(001) Si heterostructures with thin, high Ge content SiGe channels for HMOS transistors," *Modern Physics Letters B*, 2001 (abstract).

Borenstein et al., "A New Ultra-Hard Etch-Stop Layer for High Precision Micromachining," *Proceedings of the 1999 12th IEEE International Conference on Micro Electro Mechanical Systems (MEMs)* (Jan. 17-21, 1999), pp. 205-210.

Bouillon et al., "Search for the optimal channel architecture for 0.18/0.12 µm bulk CMOS experimental study," IEEE, (1996), pp. 21.2.1-21.2.4.

Bruel et al., "® Smart Cut: A Promising New SOI Material Technology," *Proceedings of the 1995 IEEE International SOI Conference* (Oct. 1995), pp. 178-179.

Bruel, "Silicon on Insulator Material Technology," *Electronic Letters*, vol. 31, No. 14 (Jul. 6, 1995), pp. 1201-1202.

Bufler et al., "Hole transport in strained $Si_{1-x}Ge_x$ alloys on $Si_{1-y}Ge_y$ substrates," *Journal of Applied Physics*, vol. 84, No. 10 (Nov. 15, 1998), pp. 5597-5602.

Burghartz et al., "Microwave Inductors and Capacitors in Standard Multilevel Interconnect Silicon Technology," *IEEE Transactions on Microwave Theory and Techniques*, vol. 44, No. 1 (Jan. 1996), pp. 100-104.

Canaperi et al., "Preparation of a relaxed Si-Ge layer on an insulator in fabricating high-speed semiconductor devices with strained epitaxial films," Intern. Business Machines Corporation, USA, 2002 (abstract).

Carlin et al., "High Efficiency GaAs-on-Si Solar Cells with High Voc Using Graded GeSi Buffers," IEEE (2000), pp. 1006-1011.

Chang et al., "Selective Etching of SiGe/Si Heterostructures," *Journal of the Electrochemical Society*, No. 1 (Jan. 1991), pp. 202-204.

Cheng et al., "Electron Mobility Enhancement in Strained-Si n-MOSFETs Fabricated on SiGe-on-Insulator (SGOI) Substrates," *IEEE Electron Device Letters*, vol. 22, No. 7 (Jul. 2001), pp. 321-323.

Cheng et al., "Relaxed Silicon-Germanium on Insulator Substrate by Layer Transfer," *Journal of Electronic Materials*, vol. 30, No. 12 (2001), pp. L37-L39.

Cullis et al., "Growth ripples upon strained SiGe epitaxial layers on Si and misfit dislocation interactions," *Journal of Vacuum Science and Technology A*, vol. 12, No. 4 (Jul./Aug. 1994), pp. 1924-1931.

Currie et al., "Carrier mobilities and process stability of strained Si n- and p-MOSFETs on SiGe virtual substrates," *Journal of Vacuum Science and Technology B*, vol. 19, No. 6 (Nov./Dec. 2001), pp. 2268-2279.

Currie et al., "Controlling Threading Dislocation in Ge on Si Using Graded SiGe Layers and Chemical-Mechanical Polishing," *Applied Physics Letters*, vol. 72, No. 14 (feb. 1998), pp. 1718-1720.

Eaglesham et al., "Dislocation-Free Stranski-Krastanow Growth of Ge on Si(100)," *Physical Review Letters*, vol. 64, No. 16 (Apr. 16, 1990), pp. 1943-1946.

Feijoo et al., "Epitaxial Si-Ge Etch Stop Layers with Ethylene Diamine Pyrocatechol for Bonded and Etchback Silicon-on-Insulator," *Journal of Electronic Materials*, vol. 23, No. 6 (Jun. 1994), pp. 493-496.

Fischetti et al., "Band structure, deformation potentials, and carrier mobility in strained Si, Ge, and SiGe alloys," *Journal of Applied Phyiscs*, vol. 80, No. 4 (Aug. 15, 1996), pp. 2234-2252.

Fischetti, "Long-range Coulomb interactions in small Si devices. Part II. Effective electronmobility in thin-oxide structures," *Journal of Applied Physics*, vol. 89, No. 2 (Jan. 15, 2001), pp. 1232-1250.

Fitzgerald et al., "Dislocation dynamics in relaxed graded composition semiconductors," *Materials Science and Engineering*, B67 (1999), pp. 53-61.

Fitzgerald et al., "Relaxed $Ge_xSi_{1-x}$ structures for III-V integration with Si and high mobility two-dimensional electron gases in Si," *Journal of Vacuum Science and Technology*, (Jul./Aug. 1992), pp. 1807-1819.

Fitzgerald et al., "Totally Relaxed $Ge_xSi_{1-x}$ Layers with Low Threading Dislocation Densities Grown on Si Substrates," *Applied Physics Letters*, vol. 59, No. 7 (Aug. 12, 1991), pp. 811-813.

Garone et al., "Silicon vapor phase epitaxial growth catalysis by the presence of germane," Applied Physics Letters, vol. 56, No. 13 (Mar. 26, 1990), pp. 1275-1277.

Godbey et al., (1990) "Fabrication of Bond and Etch-Back Silicon Insulator Using a Strained $SI_{0.7}GE_{0.3}$ Layer as an Etch Stop," Journal of the Electrical Society, vol. 137, No. 10 (Oct. 1990) pp. 3219-3223.

Gray et al., "Analysis and Design of Analog Integrated Circuits," John Wiley & Sons, 1984, pp. 605-632.

Grillot et al., "Acceptor diffusion and segregation in $(Al_xGa_{1-x})_{0.5}In_{0.5}P$ heterostructures," Journal of Applied Physics, vol. 91, No. 8 (2002), pp. 4891-4899.

Grützmacher et al., "Ge segregation in SiGe/Si heterostructures and its dependence on deposition technique and growth atmosphere," Applied Physics Letters, vol. 63, No. 18 (Nov. 1, 1993), pp. 2531-2533.

Hackbarth et al, "Alternatives to Thick MBE-Grown Relaxed SiGe Buffers," Thin Solid Films, vol. 369, pp. 148-151 (2000).

Hackbarth et al., "Strain relieved SiGe buffers for Si-based heterostructure field-effect transistors," Journal of Crystal Growth, vol. 201/202 (1999), pp. 734-738.

Halsall et al., "Electron diffraction and Raman studies of the effect of substrate misorientation on ordering in the AlGaInP system," Journal of Applied Phyiscs, vol. 85, No. 1 (1999), pp. 199-202.

Herzog et al., "SiGe-based FETs: Buffer Issues and Device Results," Thin Solid Films, vol. 380, No. 1-2, pp. 36-41 Dec. 12, 2000.

Höck et al., "Carrier mobilities in modulation in modulation doped $Si_{1-x}Ge_x$ heterostructures with respect to FET applications," Thin Solid Films, vol. 336 (1998), pp. 141-144.

Höck et al., "High hole mobility in $Si_{0.17}Ge_{0.83}$ channel metal-oxide-semiconductor field-effect transistors grown by plasma-enhanced chemical vapor deposition," Applied Physics Letters, vol. 76, No. 26 (Jun. 26, 2000), pp. 3920-3922.

Höck et al., "High performance 0.25 µm p-type Ge/SiGe MODFETs," Electronics Letters, vol. 34, No. 19 (Sep. 17, 1998), pp. 1888-1889.

Hsu et al., "Surface morphology of related $Ge_xSi_{1-x}$ films," Appl. Phys. Lett., vol. 61, No. 11 (1992), pp. 1293-1295.

Huang et al., (2001) "Carrier Mobility enhancement in strained Si-on-insulator fabricated by wafer bonding", 2001 Symposium on VLSI Technology, Digest of Technical Papers, pp. 57-58.

Huang et al., "High-quality strain-relaxed SiGe alloy grown on implanted silicon-on-insulator substrate," Applied Physics Letters, vol. 76, No. 19 (May 8, 2000), pp. 2680-2682.

Huang et al., "The Impact of Scaling Down to Deep Submicron on CMOS RF Circuits," IEEE Journal of Solid-State Circuits, vol. 33, No. 7 (Jul. 1998), pp. 1023-1036.

IBM Technical Disclosure Bulletin, "Optimal Growth Technique and Structure for Strain Relaxation of Si-Ge layers on Si Substrates," vol. 32, No. 8A (Jan. 1990), pp. 330-331.

IBM Technical Disclosure Bulletin, "2Bit/Cell EEPROM Cell Using Band to Band Tunneling for Data Read-Out," vol. 35, No. 4B (Sep. 1992), pp. 136-140.

Ishikawa et al., "Creation of Si-Ge-based SIMOX structures by low energy oxygen implantation," Proceedings of the 1997 IEEE International SOI Conference (Oct. 1997), pp. 16-17.

Ishikawa et al., "SiGe-on-insulator substrate using SiGe alloy grown Si(001)," Applied Physics Letters, vol. 75, No. 7 (Aug. 16, 1999), pp. 983-985.

Kearney et al., "The effect of alloy scattering on the mobility of holes in a $Si_{1-x}Ge_x$ quantum well, " Semiconductor Science and Technology, vol. 13 (1998), pp. 174-180.

Kim et al., "A Fully Integrated 1.9-GHz CMOS Low-Noise Amplifier," IEEE Microwave and Guided Wave Letters, vol. 8, No. 8 (Aug. 1998), pp. 293-295.

Koester et al., "Extremely High Transconductance $Ge/Si_{0.4}Ge_{0.6}$ p-MODFET's Grown by UHV-CVD," IEEE Electron Device Letters, vol. 21, No. 3 (Mar. 2000), pp. 110-112.

Konig et al., "Design Rules for N-Type SiGe Hetero FETs," Solid State Electronics, vol. 41, No. 10, pp. 1541-1547 Oct. 1, 1997.

König et al., "p-Type Ge-Channel MODFET's with High Transconductance Grown on Si Substrates," IEEE Electron Device Letters, vol. 14, No. 4 (Apr. 1993), pp. 205-207.

König et al., "SiGe HBTs and HFETs," Solid-State Electronics, vol. 38, No. 9 (1995), pp. 1595-1602.

Kuznetsov et al., "Technology for high-performance n-channel SiGe modulation-doped field-effect transistors," J. Vac. Sci. Technol., B 13(6), pp. 2892-2896 (Nov./Dec. 1995).

Langdo et al., (2002) "Preparation of Novel SiGe-free Strained Si on Insulator Substrates" IEEE International SOI Confernce, pp. 211-212 (XP002263057).

Larson, "Integrated Circuit Technology Options for RFIC's—Present Status and Future Direcitons," IEEE Journal of Solid-State Circuits, vol. 33, No. 3 (Mar. 1998), pp. 387-399.

Lee et al., "CMOS RF Integrated Circuits at 5 GHz and Beyond," Proceedings of the IEEE, vol. 88, No. 10 (Oct. 2000), pp. 1560-1571.

Lee et al., "Strained Ge channel p-type metal-oxide-semiconductor field-effect transistors grown on $Si_{1-x}Ge_x/Si$ virtual substrates," Applied Physics Letters, vol. 79, No. 20 (Nov. 12, 2001), pp. 3444-3346.

Lee et al., "Strained Ge channel p-type MOSFETs fabricated on $Si_{1-x}Ge_x/Si$ virtual substrates," Material Research Society Symposium Proceedings, vol. 686 (2002), pp. A1.9.1-A1.9.5.

Leitz et al., "Channel Engineering of SiGe-Based Heterostructures for High Mobility MOSFETs," Material Research Society Symposium Proceedings, vol. 686 (2002), pp. A3.10.1-A3.10.6.

Leitz et al., "Dislocation glide and blocking kinetics in compositionally graded SiGe/Si," Journal of Applied Physics, vol. 90, No. 6 (Sep. 15, 2001), pp. 2730-2736.

Leitz et al., "Hole mobility enhancements in strained $Si/Si_{1-y}Ge_y$ p-type metal-oxide-semiconductor field-effect transistors grown on relaxed $Si_{1-x}Ge_x$ (x>y) virtual substrates," Applied Physics Letters, vol. 79, No. 25 (Dec. 17, 2001), pp. 4246-4248.

Li et al., "Design of high speed Si/SiGe heterojunction complementary metal-oxide-semiconductor field effect transistors with reduced short-channel effects," Vacuum Science and Technology A, vol. 20, No. 3 (May/Jun. 2002), pp. 1030-1033.

Lu et al., "High Performance 0.1 µm Gate-Length P-Type SiGe MODFET's and MOS-MODFET's," IEEE Transactions on Electron Devices, vol. 47, No. 8 (Aug. 2000), pp. 1645-1652.

Maszara, "Silicon-On-Insulator by Wafer Bonding: A Review," Journal of the Electrochemical Society, No. 1 (Jan. 1991), pp. 341-347.

Meyerson et al., "Cooperative Growth Phenomena in Silicon/Germanium Low-Temperature Epitaxy," Applied Physics Letters, vol. 53, No. 25 (Dec. 19, 1988), pp. 2555-2557.

Mizuno et al., "Advanced SOI-MOSFETs with Strained-Si Channel for High Speed CMOS-Electron/Hole Mobility Enhancement," Digest of Technical Papers, 2002 Symposium on VLSI Technology, Honolulu, Jun. 13-15, New York, NY, pp. 210-211.

Mizuno et al., "Electron and Hole Mobility Enhancement in Strained-Si MOSFET's on SiGe-on-Insulator Substrates Fabricated by SIMOX Technology," IEEE Electron Device Letters, vol. 21, No. 5 (May 2000), pp. 230-232

Mizuno et al., "High Performance Strained-Si p-MOSFETs on SiGe-on-Insulator Substrates Fabricated by SIMOX Technology," IEEE IDEM Technical Digest, (1999 International Electron Device Meeting), pp. 934-936.

Nayak et al., "High-Mobility Strained-Si PMOSFET's," IEEE Transactions on Electron Devices, vol. 43, No. 10 (Oct. 1996), pp. 1709-1716.

Ota et al., "Application of heterojunction FET to power amplifier for cellular telephone," Electronic Letters, vol. 30, No. 11 (May 26, 1994), pp. 906-907.

Papananos, "Radio-Frequency Microelectronic Circuits for Telecommunication Applications," (1999), pp. 115-117, 188-193.

Parker et al., "SiGe Heterostructure CMOS Circuits and Applications", Solid-State Electronics, vol. 43, pp. 1497-1506 (1996).

Ransom et al., "Gate-Self-Aligned n-channel and p-channel Germanium MOSFET's," IEEE Transactions on Electron Devices, vol. 38, No. 12 (Dec. 1991), p. 2695.

Reinking et al., "Fabrication of high-mbility Ge p-channel MOSFETs on Si substrates," Electronics Letters, vol. 35, No. 6 (Mar. 18, 1999), pp. 503-504.

Rim, "Application of Silicon-Based Heterostructures to Enhanced Mobility Metal-Oxide-Semiconductor Field-Effect Transistors," Ph.D. Thesis, Stanford University, 1999, pp. 1-184.

Rim et al., "Enhanced Hole Mobilities in Surface-channel Strained-Si p-MOSFEts," IEEE, (1995), pp. 517-520.

Rim et al., "Fabrication and Analysis of Deep Submicron Strained-Si N-MOSFET's", IEEE Transactions on Electron Devices, vol. 47, No. 7, Jul. 2000, pp. 1406-1415.

Sadek et al., "Design of Si/SiGe Heterojunction Complementary Metal-Oxide-Semiconductor Transistors," IEEE Trans. Electron Devices, Aug. 1996, pp. 1224-1232.

Sakaguchi et al., "ELTRAN by splitting porous Si layers," Proceedings of the 195th Int. SOI Symposium, Electrochemical Society, vol. 99-3 (1999), pp. 117-121.

Schäffler, "High Mobility Si and Ge Structures," Semiconductor Science and Technology, vol. 12 (1997), pp. 1515-1549.

Sugimoto et al., "A 2V, 500 MHz and 3V, 920 MHz Low-Power Current-Mode 0.6 µm CMOS VCO Circuit," Institute of Electronics, Information and Communication Engineers, vol. E82-C, No. 7 (Jul. 1999), pp. 1327-1329.

Ternent et al., "Metal Gate Strained Silicon MOSFETs for Microwave Integrated Circuits," IEEE (Oct. 2000), pp. 38-43.

Tsang et al., "Measurements of alloy composition and strain in thin $Ge_xSi_{1-x}$ layers," Journal of Applied Physics, vol. 75, No. 12 (Jun. 15, 1994), pp. 8098-8108.

Tweet et al., "Factors determining the composition of strained GeSi layers grown with disilane and german," Applied Physics Letters, vol. 65, No. 20 (Nov. 14, 1994), pp. 2579-2581.

Usami et al., "Spectroscopic study of Si-based quantum wells with neighboring confinement structure," Semicon, Sci. Technol., 1997 (abstract).

Welser et al., "Electron Mobility Enhancement in Strained-Si N-Type Metal-Oxide Semiconductor Field-Effect Transistors," IEEE Electron Device Letters, vol. 15, No. 3 (Mar. 1994), pp. 100-102.

Welser et al., "Evidence of Real-Space Hot-Electron Transfer in High Mobility, Strained-Si Multilayer MOSFETs," IEDM, pp. 545-548 (1993).

Welser et al., "NMOS and PMOS Transistos Fabricated in Strained Silicon/Relaxed Silicon-Germanium Structures," IEEE, pp. 1000-1002 (1992).

Welser, "The application of strained-silicon/relaxed-silicon germanium heterostructures to metal-oxide-semiconductor field-effect transistors," Ph.D. Thesis, Stanford Univeristy Dept. of Electrical Engineering, 1995.

Wolf and Tauber, "Silicon Processing for the VLSI Era Vol. 1: Process Technology," Lattice Press, Sunset Beach, CA, 1986, pp. 384-386.

Xie et al., "Semiconductor Surface Roughness: Dependence of Sign and Magnitude of Bulk Strain," Physical Review Letters, vol. 73, No. 22 (Nov. 28, 1994), pp. 3006-3009.

Xie et al., "Very high mobility two-dimensional hole gas in Si/$Ge_xSi_{1-x}$/Ge structures grown by molecular beam epitaxy," Applied Physics Letters, vol. 63, No. 16 (Oct. 18, 1993), pp. 2263-2264.

Xie et al., "SiGe field effect transistors," Materials Science and Engineering, vol. 25 (1999), pp. 89-121.

Yamagata et al., "Bonding, Splitting and Thinning by Porous Si in ELTRAN; SOI- Epi Wager," Material Research Society Symposium Proceedings, vol. 681E (2001), pp. 18.2.1-18.2.10.

Yeo et al., "Nanoscale Ultra-Thin-Body Silicon-on-Insulator P-MOSFET with a SiGe/Si Heterostructure Channel," IEEE Electron Device Letters, vol. 21, No. 4 (Apr. 2000), pp. 161-163.

Zhang et al., "Demonstration of a GaAs-Based Compliant Substrate Using Wafer Bonding and Substrate Removal Techniques," IEEE, (1998), pp. 25-28.

Gannavaram, et al., "Low Temperatuer ($\leqq 800$ ° C.) Recessed Junction Selective Silicon-Germanium Source/Drain Technology for sub-70 nm CMOS," IEEE International Electron Device Meeting Technical Digest, (2000), pp. 437-440.

Ge et al., "Process-Strained Si (PSS) CMOS Technology Featuring 3D Strain Engineering," IEEE International Electron Devices Meeting Technical Digest, (2003) pp. 73-76.

Ghani et al., "A 90nm High Volume Manufacturing Logic Technology Featuring Novel 45nm Gate Length Strained Silicon CMOS Transistors," IEEE International Electron Devices Meeting Technical Digest, (2003), 978-980.

Harnada et al., "A New Aspect of Mechanical Stress Effect in Scaled MOS Devices," IEEE Transactions on Electron Devices, vol. 38, No. 4 (Apr. 1991), pp. 895-900.

Huang et al., "Isolation Process Dependence of Channel Mobility in THin-Film SOI Devices," IEEE Electron Device Letters, vol. 17, No. 6 (Jun. 1996), pp. 291-293.

Huang et al., "LOCOS-Induced Stress Effects on Thin-Film SOI Devices," IEEE Transactions on Electron Devices, vol. 44, No. 4 (Apr. 1997), pp. 646-650.

Huang, et al., "Reduction of Source/Drain Series Resistance and Its Impact on Device Performance for PMOS Transistors with Raised $Si_{1-x}Ge_x$ Source/Drain", IEEE Electron Device Letters, vol. 21, No. 9, (Sep. 2000) pp. 448-450.

Iida et al., "Thermal behavior of residual strain in silicon-on-insulator bonded wafer and effects on electron mobility," Solid-State Electronics, vol. 43 (1999), pp. 1117-1120.

Ito et al., "Mechanical Stress Effect on Etch-Stop Nitride and its Impact on Deep Submicron Transistor Design," IEEE International Electron Devices Meeting Technical Digest, (2000), pp. 247-250.

Lochtefeld et al., "Investigating the Relationship Between Electron Mobility and Velocity in Deeply Scaled NMOS via Mechanical Stress," IEEE Electron Device Letters, vol. 22, No. 12 (2001), pp. 591-593.

Ootsuka et al., "A Highly Dense, High-Performance 130nm mode CMOS Technology for Large Scale System-on-a-Chip Applications," IEEE International Electron Devices Meeting Technical Digest, (2000), pp. 575-578.

Ota et al., "Novel Locally Strained Channel Technique for High Performance 55nm CMOS,"IEEE International Electron Devices Meeting Technical Digest, (2002), pp. 27-30.

Öztürk et al., "Advanced $Si_{1-x}Ge_x$ Source/Drain and Contact Technologies for Sub-70nm CMOS," IEEE International Electron Device Meeting Techical Digest, (2002), pp. 375-378.

Öztürk, et al., "Low Resistivity Nickel Germanosilicide Contacts to Ultra-Shallow $Si_{1-x}Ge_x$ Source/Drain Junctions for Nanoscale CMOS," IEEE International Electron Device Meeting Technical Digest (2003), pp. 497-500.

Öztürk, et al., "Selective Silicon-Gremanium Source/Drain Technology for Nanoscale CMOS," Mat. Res. Soc. Symp. Proc., vol. 717, (2002), pp. C4.1.1-C4.1.12.

Öztürk, et al., "Ultra-Shallow Source/Drain Junctions for Nanoscale CMOS Using Selective Silicon-Germanium Technology," Extended Abstracts of International Workshop on Junction Technology, (2001), pp. 77-82.

Shimizu et al., "Local Mechanical-Stress Control (LMC): A New Technique for CMOS-Performance Enhancement," IEEE International Electron Device Meeting Technical Digest, (2001), pp. 433-436.

Thompson et al., "A Logic Nanotechnology Featuring Strained-Silicon," IEEE Electron Device Letters, vol. 25, No. 4 (Apr. 2004), pp. 191-193.

Thompson et al., "A 90 nm Logic Technology Featuring 50nm Strained-Silicon channel Transistors, 7 layers of Cu Interconnects, Low k ILD, and $1um^2$ SRAM Cell," IEEE International Devices Meeting Technical Digest, (2002), pp. 61-64.

Tiwari et al., "Hole Mobility Improvement in Silicon-on-Insulator and Bulk Silicon Transistors Using Local Strain," IEEE International Electron Devices Meeting Technical Digest, (1997), pp. 939-941.

Abstreiter et al., "Silicon/Germainium Strained Layer Superlattices," Journal of Crystal Growth, 95:431-438 (1989).

Ahigren et al., A SiGe HBT BICMOS Technology for Mixed-Signal RF Applications, 1997 IEEE Bipolar/BiCMOS Circuits and Tech. Meeting 195.

Ahn et al., Film Stress-Related Vacancy Supersaturation in Silicon Under Low-Pressure Chemical Vapor Deposited Silicon Nitride Films, 64 J. Applied Physics 4914 (1988).

Antonelli et al., *Pressure and Strain Effects on Diffusion*, 163 Materials Res. Soc'y Symp. Proc. 523 (1989).

Auberton-Hervé et al., "SMART CUT®: The Basic Fabrication Process for UNIBOND® SOI Wafers," IEICE Transactions on Electronics, E80-C(3):358-363 (1997).

Badenes et al, *A High Performance 0.18 um CMOS Technology Designed for Manufacturability*, 1997 Proc. 27th European Solid-State Device Res. Conf. 404.

Badenes et al., Optimization of Critical Parameters in a Low Cost, High Performance Deep Submicron CMOS Technology, 1999 Proc. 29th European Solid-State Device Res. Conf. 628.

Borland, *Novel Device Structures by Selective Epitaxial Growth (SEG)*, 1987 Int'l Electron Devices Meeting Tech. Dig. 12.

Borland et al., Low Temperature Low Pressure Silicon Epitaxial Growth and Its Application to Advanced Dielectric Isolation Technology, 1986 Extended Abstracts 18th Int'l Conf. on Solid State Devices and Materials 53 (1986).

Carns et al, Hole Mobility Measurements in Heavily Doped Si1-xGex Strained Layers, 41 *IEEE Transactions on Electron Devices* 1273 (1994).

C. Carter et al., Residual Defects Following Rapid Thermal Annealing of Shallow Boron and Boron Fluoride Implants into Preamorphized Silicon, 44 *Applied Physics Letters* 459 (1984).

Chau et al., "Advanced CMOS Transistors in the Nanotechnology Era for High-Performance, Low-Power Logic Applications," pp. 26-30 (2004).

Cowern et al., *Diffusion in Strained Si(Ge)*, 72 *Physical Review Letters* 2585 (1994).

Cressler, SiGe HBT Technology: A New Contender for Si-Based RF and Microwave Circuit Applications, 46 *IEEE Transactions on Microwave Theory and Tech.* 572 (1998).

Czaja, Conditions for the Generation of Slip by Diffusion of Phosphorus into Silicon, 37 J. Applied Physics 3441 (1966).

Daembkes et al., *The n-Channel SiGe/Si Modulation-Doped Field-Effect Transistor*, 33 *IEEE Transactions on Electron Devices* 633 (1986).

Eichinger et al., "Characterization of MBE Growth SiGe Superlattices with SIMS and RBS," Proceedings of the First International Symposium on Silicon Molecular Beam Epitaxy, 85(7):367-375 (1985).

Endo et al., *Novel Device Isolation Technology with Selective Epitaxial Growth*, 1982 Int'l Electron Devices Meeting Tech. Dig. 241.

Endo et al., *Scaled CMOS Technology Using SEG Isolation and Buried Well Process*, 33 *IEEE Transactions on Electron Devices* 1659 (1986).

Examination Report for European Patent Application No. 02 709 406.9-2203, dated Mar. 24, 2005, 5 pages.

Examination Report for European Patent Application No. 98 931 529.6-2203, dated Jan. 10, 2002, 4 pages.

Examination Report for European Patent Application No. 01 973 651.1-1528, dated Mar. 22, 2004, 3 pages.

Examination Report for European Patent Application No. 01 989 893.1-1235, dated Aug. 16, 2004, 5 pages.

Examination Report for European Patent Application No. 98 931 529.6-2203, dated May 9, 2003, 5 pages.

Examination Report for European Patent Application No. 01 973 651.1-1528, dated Nov. 12, 2004, 9 pages.

Examination Report for European Patent Application No. 02 709 406.9-2203, dated May 11, 2004, 3 pages.

Fahey et al., *Point Defects and Dopant Diffusion in Silicon*, 61 Reviews of Modern Phyiscal 289 (1989).

Fair, Boron Diffusion in Silicon-Concentration and Orientation Dependence, Background Effects and Profile Estimation, 122 *J. Electrochemical Soc'y* 800 (1975).

Fair, "Concentration Profiles of Diffused Dopants in Silicon," in *Impurity Doping Processes in Silicon*, Chapt. 7, pp. 318-442 (1981).

Fair, "Quantified Conditions for Emitter-Misfit Dislocation Formation in Silicon," Journal of the Electrochemical Society, 125(6):923-926 (1978).

Fathy et al., "Formation of epitaxial layers of Ge on Si substrates by Ge implantation and oxidation," Applied Physics Letters, 51(17): 1337-1339 (1987).

Fitch, Selectivity Mechanisms in Low Pressure Selective Epitaxial Silicon Growth, 141 *J. Electrochemical Soc'y* 1046 (1994).

Fitzgerald et al., "Dislocations in Relaxed SiGe/Si Heterostructures," Phys. Stat. Sol. A, Applied Research, Berlin, De, vol. 171, Nr. 1, (1999) pp. 227-238.

Fuller et al. Diffusion of Donor and Acceptor Elements in Silicon, 27 J. Applied Physics 544 (1956).

Gaworzewski et al., Electrical Properties of Lightly Doped p- Type Silicon-Germanium Single Crystals, 83 J. Applied Physics 5258 (1998).

Ghani et al., "Effect of oxygen on minority-carrier lifetime and recombination currents in Si1- xGex heterostructure devices," Applied Physics Letters, 58(12): 1317-1319 (1991).

Gibbons et al., "Limited reaction processing: Silicon epitaxy." Applied Physics Letters, 47(7): 721-723 (1985).

Godbey et al., "A Si0.7Ge0.3 Strained Layer Etch Stop for the Generation of Bond and Etch Back SOI," IEEE SOS/SOI Tech. Conf. Proc., pp. 143-144 (1989).

Goo et al., *Scalability of Strained-Si nMOSFETs Down nm Gate Length*, 24 *IEEE Electron Device Letters* 351 (2003).

Gronet et al., "Growth of GeSi/Si strained-layer superlattices using limited reaction processing," 61 J. Applied Physics, No. 6, pp. 2407-2409 (1987).

Gwoziecki et al., *Suitability of Elevated Source/Drain for Deep Submicron CMOS*, 1999 Proc. 29th European Solid-State Device Res. Conf. 384.

Harame et al., *A High Performance Epitaxial SiGe-Base ECL BiCMOS Technology*, 1992 Int'l Electron Devices Meeting Tech. Dig. 19.

Hobart et al., "Ultra-cut: A Simple Technique for Fabrication of SOI Substrates with Ultra-Thin (<5 nm) Silicon Films," Proceedings 1998 IEEE International SOI Conference, pp. 145-146 (1998).

Holländer et al., "Reduction of Dislocation Density of MBE-Grown Si1-xGex Layers on (100) Si by Rapid Thermal Annealing," Thin Solid Films, 183: 157-164 (1989).

Hopkins et al., *Enhanced Diffusion in Boron Implanted Silicon*, 132 *Journal of the Electrochemical Society* 2035 (1985).

Hu et al., "Channel and Source/Drain Engineering in High-Performance Sub-0.1 um NMOSFETs Using X-Ray Lithography," *1994 Symp. On VLSI Technology, Digest of Technical Papers* 17.

Huang et al., "SiGe-on-insulator prepared by wafer bonding and layer transfer for high-performance field-effect transistors," Applied Physics Letters, 78(9): 1267-1269 (2001).

Huang et al., N-Channel MOS Transistors Below 0.5 um with Ultra-Shallow Channels Formed by low Temperature Selective Silicon Epitaxy, 387 Materials Res. Soc'y Symp. Proc. 347 (1995).

Hull et al., "Structural Studies of GeSi/Si Heterostructures," Proceedings of the First International Symposium on Silicon Molecular Beam Epitaxy, 85(7): 376-384 (1985).

International Search Report for International Patent Application No. PCT/US02/03688, dated Jul. 5, 2002, 4 pages.

International Search Report for Patent Application No. PCT/US98/13076, dated Oct. 27, 1998, 2 pages.

Ishitani et al., "Local Loading Effect in Selective Silicon Epitaxy," 23 *Japanese Journal of Applied Physics* L391 (1984).

Ismail et al., "Extremely high electron mobility in Si/SiGe modulation-doped heterostructures," Applied Physics Letters, 66(9): 1077-1079 (1995).

Ismail et al., "Identification of a Mobility-Limiting Scattering Mechanism in Modulation-Doped Si/SiGe Heterostructures," Phyiscal Review Letters, 73(25): 3447-3452 (1994).

Ismail et al., "Gated Hall effect measurements in high-mobility n-type Si/SiGe modulation-doped heterostructures," Applied Physics Letters, 66(7): 842-844 (1995).

Jain et al., Theoretical Calculations of the Fermi Level and of Other Parameters in Phosphorus Doped Silicon at Diffusion Temperatures, 21 *IEEE Transactions on Electron Devices* 155 (1974).

Kasper, "Growth and Properties of Si/SiGe Superlattices," Surface Science, 174: 630-639 (1986).

Kato, The Annealing Time and Temperature Dependence of Electrical Dopant Activation in High-Dose BF2 Ion Implanted Silicon, 141 *Journal of the Electrochemical Society* 3158 (1994).

Kim et al., Properties of c-Axis-Oriented Freestanding GaN Substrates Prepared on Fused Silica Glass by Hydride Vapor Phase Epitaxy, 33 *Journal of the Korean Physical Society* L1 (1998).

King et al., Si/Si$_{1-x}$Ge$_x$ Heterojunction Bipolar Transistors Produced by Limited Reaction Processing, 10 *IEEE Electron Device Letters* 52 (1989).

Kitajima et al., *Crystalline Defects in Selectivety Epitaxial Silicon Layers*, 22 *Japanese Journal of Applied Physics* L783 (1983).

Klauk et al., "Thermal stability of undoped strained Si channel SiGe heterostructures," 68 Applied Physics Letters, pp. 1975-1977 (1996).

Kubota M. et al., "New SOI CMOS Process with Selective Oxidation," IEEE IEDM TECH. DIG., pp. 814-816 (1986).

Kuo, et al., Effects of Strain on Boron Diffusion in Si and Si$_{1-x}$Ge$_x$, 66 *Applied Physics Letters* 580 (1995).

Lee et al., *High Quality Thin Epitaxial Silicon Layers Deposited Selectively by Rapid Thermal Processing*, 1989 Proc. Second Int'l Symp' on Ultra Large Scale Integration Sci. Tech. 233.

Loechelt et al., "Measurement and Modeling of Boron Diffusion in Si and Strained Si$_{1-x}$Ge$_x$ Epitaxial Layers During Rapid Thermal Annealing," 74 J. Applied Physics 5520 (1993).

Lunnon et al., "Furnace and Rapid Thermal Annealing of P$^+$/n Junctions in BF$_2$$^+$-Implanted Silicon," 132 *Journal of the Electrochemical Society* 2473 (1985).

Maleville et al., "Physical Phenomena Involved Involved in the Smart-Cut® Process," Electrochemical Society Proceedings, 96(3): 34-46 (1996).

Maseeh et al., *Plastic Deformation of Highly Doped Silicon*, A21-A23 Sensors & Actuators 861 (1990).

Mazurè et al., Facet Engineered Elevated Source/Drain by Selection Si Epitaxy for 0.35 Micron MOSFETS, 1992 *Int'l Electron Devices Meeting Tech. Dig.* 853.

Mehregany et al., *Anisotropic Etching of Silicon in Hydrazine*, 13 Sensors and Actuators 375 (1988).

Meyerson, "Low-Temperature Silicon Epitaxy by Ultrahigh Vacuum/Chemical Vapor Deposition," 48 *Applied Physics Letters* 797 (1986).

Mieno et al., "Selective Doped Polysilicon Growth," 134 *Journal of the Electrochemical Society* 11, 2862-2867 (1987).

Ming et al., "Microscopic structure of interfaces in Si$_{1-x}$Ge$_x$/Si heterostructures and superlattices studied by x-ray scattering and flourescence yield," *Physical Review B*, vol. 47, No. 24, pp. 373-381, Jun. 15, 1993.

Ming et al., "Interfacial roughness scaling and strain in lattice mismatched Si$_{0.4}$Ge$_{0.6}$ thin films on Si," *Applied Physics Letters*, vol. 67, No. 5, Jul. 31, 1995, pp. 629-631.

Mirabedini et al., Submicrometre Elevated Source and Drain MOSFET Technology Using E-Beam Evaporated Silicon, 33 *Electronics Letters* 1183 (1997).

Mistry et al., "Delaying Forever: Uniaxial Strained Silicon Transistors in a 90nm CMOS Technology," Symposium on VLSI Technology Digest of of Technical Papers, pp. 50-51 (2004).

Miyake et al., Transient Enhanced Diffusion of Ion-Implanted Boron in Si During Rapid Thermal Annealing, 63 J. Applied Physics 1754 (1988).

Miyauchi et al., "Low-Temperature (850°C) Silicon Selective Epitaxial Growth on HF-Treated Si (100) Subtrates Using SiH4-HCl-H2 Systems," 138 *Journal of the Electrochemical Society* 3480 (1991).

Mizuo et al., "Anomalous Diffusion of B and P in Si Directly Masked with Si$_3$N$_4$," 21 *Japanese Journal of Applied Physics* 281 (1982).

Moslehi et al., *Single-Wafer Intergrated Semiconductor Device Processing*, 39 *IEEE Transactions on Electron Devices* 4 (1992).

Monroe et al., "Comparison of mobility-limiting mechanisms in high-mobility Si1-xGex heterostructures," Journal of Vac. Sci. Technol. B, 11(4): 1731-1737 (1993).

Moriya et al., "Boron Diffusion in Strained Si$_{1-x}$Ge$_x$ Epitaxial Layers," 71 *Physical Review Letters* 883 (1993).

Moriya et al., "Doping and Electrical Characteristics of In Situ Heavily B-Doped Si$_{1-x}$Ge$_x$ Films Epitaxially Grown Using Ultraclean LPCVD," 343-344 *Thin Solid Films* 541 (1999).

Murota et al., "CVD Si$_{1-x}$Ge$_x$ Epitaxial Growth and its Doping Control," 27 *Journal of the Japanese Ass'n for Crystal Growth* 171 (2000).

Nakahara et al., Ultra-Shallow in-Situ-Doped Raised Source/Drain Structure for Sub- Tenth Micron CMOS, *1996 Symp. on VLSI Tech., Dig., Dig. Tech. Papers* 174.

Nishi et al., "Handbook of Semiconductor Maunufacturing Technology," Marcel Dekker AG, New York, NY, 2000, pp. 1-22.

Noble et al., "Reduction in misfit dislocation density by the selective growth of Si1-xGex/Si in small areas," Applied Physics Letters, 56(1): 51-53 (1990).

Noda et al., "Doping and Electrical Characteristics of In-situ Heavily B-Doped Si$_{1-x-y}$Ge$_x$C$_y$ Films Epitaxially Grown Using Ultraclean LPCVD," 380 *Thin Solid Films* 57 (2000).

Noh et al., "Contact Resistivity Between Tungsten and Impurity (P and B)-doped Si$_{1-x-y}$Ge$_x$C$_y$ Epitaxial Layer," 212-213 *Applied Surface Sci.* 679 (2003).

O'Neill et al., "Deep Submicron CMOS Based on Silicon Germanium Technology," *IEEE Transactions on Electron Devices*, vol. 43, No. 6, Jun. 1996, pp. 911-918.

Park et al., Analysis of Ion-Implanted Amorphous and Polycrystalline Silicon Films as Diffusion Sources for Ultrashallow Junctions, 70 J. Applied Physics 1397 (1991).

Patton et al., Silicon-Germanium-Base Heterojunction Bipolar Transistors by Molecular Beam Epitaxy, 9 *IEEE Electron Device Letters* 165 (1988).

Pfiester et al., Anomalous Co-Diffusion Effects of Germanium on Group III and V Dopants in Silicon, 52 *Applied Physics Letters* 471 (1988).

Powell, "Activation of Shallow, High-Dose BF$_2$+ Implants into Silicon by Rapid Thermal Processing," 56 J. Applied Physics 2837 (1984).

Prinz et al., "The Effects of Base Dopant Outdiffusion and Undoped Si$_{1-x}$Ge$_x$ Junction Spacer Layers in Si/Si$_{1-x}$Ge$_x$/Si Heterojunction Bipolar Transistors," 12 *IEEE Electron Device Letters* 42 (1991).

Prinz et al., "The Effect of Base-Emitter Spacers and Strain Dependent Densities of States in Si/Si$_{1-x}$Ge$_x$/Si Heterojunction Bipolar Transistors," 1989 *Int'l Electron Devices Meeting Tech. Dig.* 639.

Rim et al. Characteristics and Device Design of Sub-100 nm Strained Si N- and PMOSFETs, *2002Symp. on VLSI., Digest Tech. Papers* 98.

Rim et al., Low Field Mobility Characteristics of Sub-100 nm Unstrained and Strained Si MOSFETs, 2002 *Int'l Electron Devices Meeting Tech. Dig.* 43.

Rim et al., *Strained Si NMOSFETs for High Performance CMOS Technology*, 2001 *Symp. on VLSI Tech., Digest Tech. Papers* 59.

Rodrigues et al., "Strain Compensation by Heavy Boron Doping in Si$_{1-x}$Ge$_x$ Layers Grown by Solid Phase Epitaxy," 12 *J. Materials Res.* 1698 (1997).

Rosenblad et al., "Strain relaxation of graded SiGe buffers grown at very high rates," Materials Science and Engineering, B71 (2000) pp. 20-23.

Ryssel et al., High Concentration Effects of Ion Implanted Boron in Silicon, 22 *Applied Physics* 35 (1980).

Schäffler, "Letter to the Editor, High-electron-mobilty Si/SiGe heterostructures: influence of the relaxed SiGe buffer layer," Semicond. Sci. Technol., 7: 260-266 (1992).

Schumann et al., *Impact of Elevated Source/Drain on the Reverse Short Channel Effect*, 1999 Proc. 29th Europeon Solid-State Device Res. Conf. 572.

Shifren et al., "Drive current enhancement in p-type metal-oxide-semiconductor field-effect transistors under shear uniaxial stress," Applied Physics Letters, 85(25): 6188-6190 (2004).

Simard-Normandin, "Electrical Characteristics and Contact Resistance of B$^+$-and BF$_2$ $^+$- Implanted Silicon Diodes with Furnace and Rapid Thermal Annealing," 32 *IEEE Transactions on Electron Devices* 1354 (1985).

Solmi et al., High-Concentration Boron Diffusion in Silicon: Simulation of the Precipitation Phenomena, 68 J. Applied Physics 3250 (1990).

Song et al., Facet Formation in Selectively Overgrown Silicon by Reduced Pressure Chemical Vapor Deposition, 1998 Dig. Papers Microprocesses and Nanotechnology '98 240.

Stach et al., *Anomalous Boron Diffusion in Silicon from Planar Boron Nitride Sources*, 121 *Journal of the Electrochemical Society* 722 (1974).

Stivers et al., *Growth Condition Dependence of SEG Planarity and Electrical Characteristics*, 1987 Proc. Tenth Int'l Conf. on Chemical Vapor Deposition 389.

Subbanna et al., "How SiGe Evolved into a Manufacturable Semiconductor Production Process," IEEE International Solid-State Circuits Conference, pp. 56, 67, 446 (1999).

Sugii et al., "Role of $Si_{1-x}Ge_x$ buffer layer on mobility enhancement in a strained-Si n-channel metal-oxide-semiconductor field-effect transistor," 75 *Applied Physics Letters*, No. 19, pp. 2948-50 (1999).

Sugiyama et al., "Formation of strained-silicon layer on thin relaxed-SiGe/SiO2/Si structure using SIMOX technology," Thin Solid Films, 369: 199-202 (2000).

Sun et al., "Elevated $n^+/p$ Junctions by Implant into $CoSi_2$ Formed on Selective Epitaxy for Deep Submicron MOSFET's," 45 *IEEE Transactions on Electron Devices* 1946 (1998).

Sun et al., Parasitic Resistance Considerations of Using Elevated Source/Drain Technology for Deep Submicron Metal Oxide Semiconductor Field Effect Transistors, 145 *Journal of the Electrochemical Society* 2131 (1998).

Suzuki et al., Effects of Si-Ge Buffer Layer for Low-temperature Si Epitaxial Growth on Si Substrate by rf Plasma Chemical Vapor Deposition, 54 J. Applied Physics 1466 (1983).

Tanno et al., *Selective Silicon Epitaxy Using Reduced Pressure Technique*, 21 *Japanese Journal of Applied Physics* L564 (1982).

Taraschi et al., "Strained-Si-on-Insulator (SSOI) and SiGe-on-Insulator (SGOI): Fabrication Obstacles and Solutions," Mat. Res. Soc. Symp. Proc., 745:105-110 (2003).

Taraschi et al., "Relaxed SiGe-on-insulator fabricated via wafer bonding and etch back," Journal of Vac. Sci. Technol. B, 20(2): 725-727 (2002).

Taraschi et al., "Relaxed SiGe on Insulator Fabricated via wafer Bonding and Layer Transfer: Etch-Back and Smart-Cut Alternatives," Electrochemical Society Proceedings, 2001(3):27-32 (2001).

Tsai et al., "Recrystallization of Implanted Amorphous Silicon Layers. I. Electrical Properties of Silicon Implanted with $BF^+_2$ or $Si^+ + B^{+a}$ )," 50 J. Applied Physics 183 (1979).

van Dort et al., Influence of High Substrate Doping Levels on the Threshold Voltage and the Mobility of Deep-Submicrometer MOSFET's, 39 *IEEE Transactions on Electron Devices* 932 (1992).

van Meer et al., High Performance Raised Gate/Source/Drain Transistors for Sub-0.15 μm CMOS Technologies, 1999 Proc. 29th European Solid-State Device Res. Conf. 388.

van Oostrum et al., Characterization of Epitaxial Layers by the Depth Dependence of Boron Diffusivity, 61 *Applied Physics Letters* 1513 (1992).

Vossen et al., "Thin Film Processes II," Academic Press Inc., San Diego, CA, 1991, pp. 370-442.

Waite et al., *A Novel Deep Submicron Elevated Source/Drain MOSFET*, 1998 Proc. 28th European Solid-State Device Res. Conf. 148.

Walker et al., Shallow Boron Junctions and Preamorphization for Deep Submicron Silicon Technology, 73 J. Applied Physics 4048 (1993).

Wang, Identification and Measurement of Scaling-Dependent Parasitic Capacitances of Small-Geometry MOSFET's, 43 *IEEE Transactions on Electron Devices* 965 (1996).

Weldon et al., Raised Source-Drains Using Selective Silicon Deposition for Sub-Half Micron CMOS Devices, 94-2 *Extended Abstracts Fall Meeting Electrochemical Soc'y* 756 (1994).

Wong, *Beyond the Conventional Transistor*, 46 *IBM J. Res. & Dev.* 133 (2002).

Yamakawa et al., Drivability Improvement on Deep-Submicron MOSFET's by Elevation of Source/Drain Regions, 20 *IEEE Electron Device Letters* 366 (1999).

Gannavaram, et al. "Low Temperature (<800°C) Recessed Junction Selective Silicon-Germanium Source/Drain Technology for sub-70 nm CMOS," *IEEE International Electron Device Meeting Technical Digest*, (2000), pp. 437-440.

Ge et al., "Process-Strained Si (PSS) CMOS Technology Featuring 3D Strain Engineering," *IEEE International Electron Devices Meeting Technical Digest*, (2003) pp. 73-76.

Ghani et al., "A 90nm High Volume Manufacturing Logic Technology Featuring Novel 45nm Gate Length Strained Silicon CMOS Transistors," *IEEE International Electron Devices Meeting Technical Digest*, (2003), 978-980.

Hamada et al., "A New Aspect of Mechnical Stress Effects in Scaled MOS Devices," *IEEE Transactions on Electron Devices*, vol. 38, No. 4 (Apr. 1991), pp. 895-900.

Huang et al., "Isolation Process Dependence of Channel Mobility in Thin-Film SOI Devices," *IEEE Electron Device Letters*, vol. 17, No. 6 (Jun. 1996), pp. 291-293.

Huang et al., "LOCOS-Induced Stress Effects on Thin-Film SOI Devices," *IEEE Transactions on Electron Devices*, vol. 44, No. 4 (Apr. 1997), pp. 646-650.

Huang, et al., "Reduction of Source/Drain Series Resistance and Its Impact on Device Performance for PMOS Transistors with Raised $Si_{1-x}Ge_x$ Source/Drain", *IEEE Electron Device Letters*, vol. 21, No. 9, (Sep. 2000) pp. 448-450.

Iida et al., "Thermal behavior of residual strain in silicon-on-insulator bonded wafer and effects on electron mobility," *Solid-State Electronics*, vol. 43 (1999), pp. 1117-1120.

Ito et al., "Mechanical Stress Effect on Etch-Stop Nitride and its Impact on Deep Submicron Transistor Design," *IEEE International Electron Devices Meeting Technical Digest*, (2000), pp. 247-250.

Lochtefeld et al., "Investigating the Relationship Between Electron Mobility and Velocity in Deeply Scaled NMOS via Mechanical Stress," *IEEE Electron Device Letters*, vol. 22, No. 12 (2001), pp. 591-593.

Ootsuka et al., "A Highly Dense, High-Performance 130nm node CMOS Technology for Large Scale System-on-a-Chip Applications," *IEEE International Electron Devices Meeting Technical Digest*, (2000), pp. 575-578.

Ota et al., "Novel Locally Strained Channel Technique for High Performance 55nm CMOS," *IEEE International Electron Devices Meeting Technical Digest*, (2002), pp. 27-30.

Öztürk, et al., "Advanced $Si_{1-x}Ge_x$ Source/Drain and Contact Technologies for Sub-70 nm CMOS," *IEEE International Electron Device Meeting Technical Digest*, (2002), pp. 375-378.

Öztürk, et al., "Low Resistivity Nickel Germanosilicide Contacts to Ultra-Shallow $Si_{1-x}Ge_x$ Source/Drain Junctions for Nanoscale CMOS," *IEEE International Electron Device Meeting Technical Digest* (2003), pp. 497-500.

Öztürk, et al., "Selective Silicon-Gremanium Source/Drain Technology for Nanoscale CMOS," *Mat. Res. Soc. Symp. Proc.*, vol. 717, (2002), pp. C4.1.1-C4.1.12.

Öztürk, et al., "Ultra-Shallow Source/Drain Junctions for Nanoscale CMOS Using Selective Silicon-Germanium Technology," *Extended Abstracts of International Workshop on Junction Technology*, (2001), pp. 77-82.

Shimizu et al., "Local Mechanical-Stress Control (LMC): A New Technique for CMOS-Performance Enhancement," *IEEE International Electron Devices Meeting Technical Digest*, (2001), pp. 433-436.

Thompson et al., "A Logic Nanotechnology Featuring Strained-Silicon," *IEEE Electron Device Letters*, vol. 25, No. 4 (Apr. 2004), pp. 191-193.

Thompson et al., "A 90 nm Logic Technology Featuring 50nm Strained-Silicon Channel Transistors, 7 layers of Cu *Interconnects*, Low k ILD, and 1 $um^2$ SRAM Cell," *IEEE International Electron Devices Meeting Technical Digest*, (2002), pp. 61-64.

Tiwari et al., "Hole Mobility Improvement in Silicon-on-Insulator and Bulk Silicon Transistors Using Local Strain," *IEEE International Electron Devices Meeting Technical Digest*, (1997), pp. 939-941.

METHODS OF FORMING REACTED CONDUCTIVE GATE ELECTRODES

RELATED APPLICATIONS

This application is a divisional application of U.S. patent application Ser. No. 10/179,079, filed Jun. 25, 2002, now U.S. Pat. No. 6,982,474 the entire disclosure of which is incorporated by reference herein.

TECHNICAL FIELD

The invention generally relates to semiconductor devices, and, more particularly, to the fabrication and structure of contacts in transistors.

BACKGROUND INFORMATION

Continuous improvements in the fabrication and design of semiconductor transistors used in integrated circuit devices have permitted ever greater area densities of transistors. Development of materials and processing for interconnects and contacts plays a large role in transistor development.

Materials and processes for forming conductive contacts and interconnects must accommodate, for example, dimensional requirements, processing temperatures, reliability needs and materials compatibility. Traditional aluminum-based interconnects have gradually given way to copper interconnects for fine dimensions; cobalt silicide and other metallic materials are gradually supplanting titanium silicide source and drain contacts and titanium silicide caps on doped polycrystalline silicon gate contacts.

Another avenue for improvement in device performance involves the use of newer types of substrates as replacements for traditional silicon wafers. For example, wafers that have a silicon-germanium (SiGe) layer can provide improved channel layer performance in a strained-silicon layer grown on the SiGe layer.

Mobility enhancements obtained from strained silicon, in combination with source-drain and gate silicidation techniques, provide the opportunity to increase speed, reduce power consumption, and provide the basis of other advances in microelectronics, such as analog and digital device integration.

The use of substrates that include a SiGe layer, however, can increase fabrication complexity relative to that for conventional silicon wafer-based devices. For example, formation of source and drain contacts through reaction of a metal layer, such as titanium or cobalt, with SiGe in the substrate has preferred process conditions that are different from silicide formation with relatively pure silicon.

SUMMARY OF THE INVENTION

The invention involves structures and fabrication methods for semiconductor devices that preferably have semiconductor layers including two materials in both a substrate and in a gate contact. The invention provides simplified processing for semiconductor devices, as well as improved semiconductor device structures that include compound and/or alloyed semiconductors in both contacts and substrates. The invention provides for simultaneous reaction of a metal layer to form reacted material contacts in the substrate and a reacted material upper portion of a gate contact. The metal layer exhibits a similar reaction behavior with the semiconductor layers in both the substrate and in the upper portion of the gate contact due to a similar composition ratio of the two materials in both semiconductor layers.

Preferred embodiments of the invention feature substrates and contacts that include one or more semiconductor alloy layers of silicon and germanium. Preferred embodiments include SiGe layers of similar composition in both a substrate and a contact; conductive portions are formed by simultaneously reacting the SiGe layers in the substrate and the contact with a metal layer. Thus, for example, source and drain contacts in a substrate can be formed simultaneously with formation of a conductive upper (distal) portion of a gate contact having a portion that includes the semiconductor alloy. In this way, some processing steps are rendered unnecessary during basic device fabrication.

Simplified processing can be achieved in part because reaction of a metal layer with the substrate and with a semiconductor layer in a gate contact need not be decoupled to accommodate, for example, SiGe in the substrate and polycrystalline silicon in the gate. Proper material selection provides substrates and gate contacts that have similar or identical silicide formation steps. Other benefits can arise, such as lower temperature processing for silicide formation.

In preferred embodiments, the invention features transistors that include a gate electrode including SiGe in at least an upper portion of a gate contact (i.e., electrode) and a strained-silicon channel layer on a relaxed SiGe layer in a substrate. By having SiGe in an upper portion of a gate electrode, the silicidation of gate and source-drain regions can be performed in a single process. A lower portion of the gate contact can have a different material composition, chosen to provide, for example, a desired electrical property and/or compatibility with a gate dielectric material.

Thus, in a first aspect, the invention features a method for fabricating a semiconductor device. The method includes provision of a semiconductor layer that includes a first material and a second material. The semiconductor layer can be an alloy of two or more materials. The first and second materials can be silicon and germanium.

The semiconductor layer can be or include a relaxed layer. The relaxed layer can be part of a substrate having a portion, adjacent to the relaxed layer, with a lattice spacing mismatched to that of the relaxed layer. For example, the relaxed layer can be grown on intermediate layers that accommodate mismatch to a silicon wafer. As another example, the relaxed layer can reside on an oxide layer.

The method also includes the formation of a contact that has a portion proximal to the relaxed semiconductor layer and a portion distal to the relaxed semiconductor layer. The distal portion includes the first material and the second material. A metal layer is formed adjacent to the relaxed semiconductor layer and adjacent to the distal portion of the contact. The metal layer is simultaneously reacted with the relaxed semiconductor layer and with the distal portion of the contact.

The silicon and germanium of the distal portion of the contact can have an atomic density ratio that is substantially the same as an atomic density ratio of the silicon and germanium of the relaxed semiconductor layer. The proximal portion of the contact can consist essentially of silicon or essentially of germanium. Alternatively the proximal portion can include silicon and germanium, the atomic density ratio of the silicon and germanium of the proximal portion can differ from the atomic density ratio of the silicon and germanium of the distal portion.

In a second aspect, the invention features a semiconductor device. The device includes a substrate that has a reacted conductive layer that comprises silicon, germanium and a metallic material. The metallic material can be, e.g., titanium, nickel or cobalt. The device also includes a contact that has a portion proximal to the substrate and a reacted conductive portion distal to the substrate. The reacted conductive distal portion of the contact includes silicon, germanium and the same metallic material as in the substrate reacted conductive layer. The substrate can further include a strained semiconductor layer, for example, of silicon, adjacent to the contact.

In a third aspect, the invention features a semiconductor device that includes a substrate that has a reacted conductive layer comprising a first material, a second material and a metallic material. The device includes a contact having a portion proximal to the substrate and a reacted conductive portion distal to the substrate, the distal portion comprising the first material, the second material and the metallic material.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

DESCRIPTION

Various features of the invention are well suited to application in metal-oxide-semiconductor (MOS) transistors having Si, $Si_{1-x}Ge_x$ and/or Ge layers in and or on a substrate. The invention provides means to avoid separation of metal layer reaction with the substrate and metal layer reaction with a polycrystalline silicon portion of a gate contact. The invention further provides improved gate design in conjunction with the advantages of a substrate that includes a SiGe layer, among other advantages.

The term "MOS" is here used to refer generally to semiconductor devices that include a conductive gate spaced at least by an insulting layer from a semiconducting channel layer. The terms "SiGe" and "$Si_{1-x}Ge_x$" are here used interchangeably to refer to silicon-germanium alloys. The term "silicide" is here used to refer to a reaction product of a metal, silicon, and optionally other components, such as germanium. The term "silicide" is also used, less formally, to refer to the reaction product of a metal with an elemental semiconductor, a compound semiconductor or an alloy semiconductor.

Figure 1:
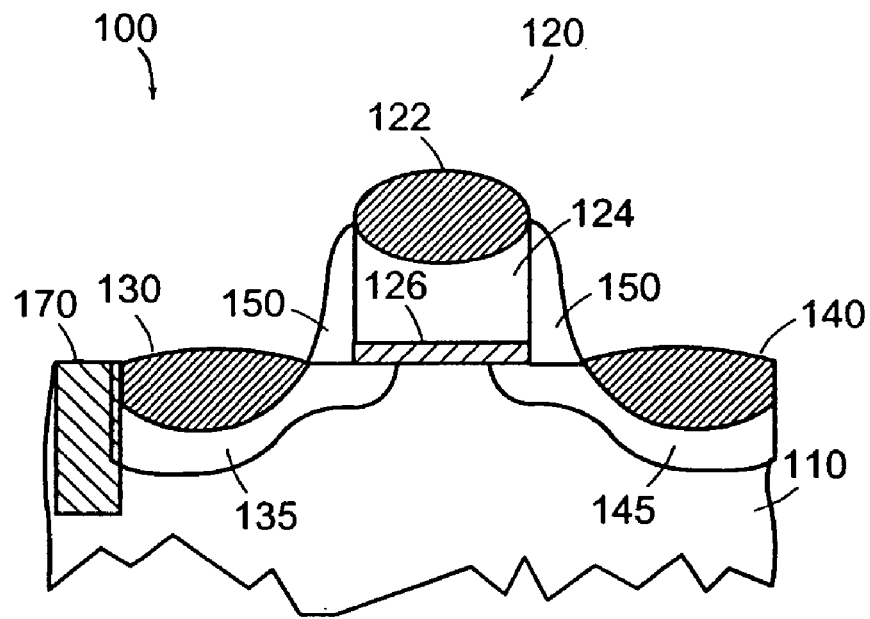
FIG. 1 is a cross-sectional view of a conventional silicon-based MOSFET.

First, with reference to FIG. 1, to provide a context for description of features of the invention, the structure and operation of a conventional MOSFET are described. FIG. 1 is cross-sectional view of a conventional silicon-based MOS field-effect transistor (MOSFET) 100. The transistor 100 includes a gate contact 120, a pair of spacers 150, a source 135, a source silicide contact 130, a gate oxide 126, a drain 145, a drain silicide contact 140 and a silicon substrate 110. The transistor 100 is electrically isolated from neighboring transistors by a shallow trench isolation (STI) portion 170.

The gate contact 120 includes a doped, conductive polycrystalline silicon ("polysilicon") portion 124 proximal to the gate oxide 126 and a distal gate silicide portion 122. The source 135 and drain 145 include doped regions formed by implantation of dopant species into the substrate 110 and annealing, with the spacers 150 controlling the distribution of dopant beneath the gate oxide 126. The silicide contacts 130, 140 and gate silicide portion 122 provide good ohmic interfaces respectively to the source 135 and drain 145 and to the gate polysilicon portion 124.

The MOSFET 100 has a surface channel, which may be defined in physical or electrical terms. Physically, the surface channel is the p-type or n-type silicon that is adjacent to (i.e., below) the gate oxide 126 and which joins the source 135 and drain 145. Electrically, the channel is an inversion layer, which provides current flow between the source 135 and drain 145. Thus, from the electrical point of view, the presence and condition of the channel are variable.

Figure 2:
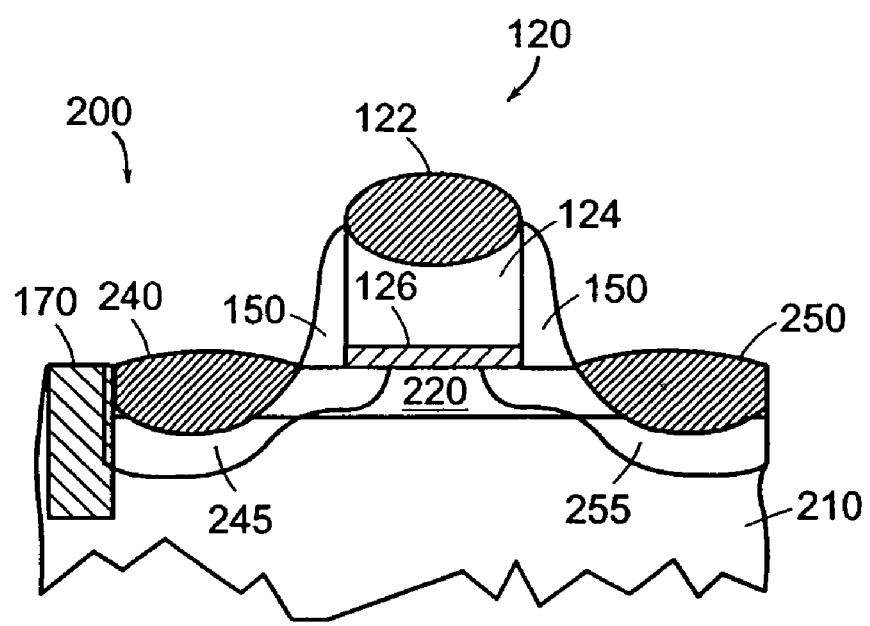
FIG. 2 is a cross-sectional view of an embodiment of a MOSFET that includes a strained-silicon channel layer on a SiGe layer.

FIG. 2 is a cross-sectional view of an embodiment of a MOSFET 200, which is distinguished from the MOSFET 100 of FIG. 1 by the inclusion of a strained-silicon channel layer on a SiGe layer. The following description of the structure of the MOSFET 200 is limited to features that are substantially different from features of the conventional MOSFET 100.

The MOSFET 200 includes a strained-silicon layer 220, a source 245, a drain 255, a source contact 240, a drain contact 250 and a substrate 210 that includes a relaxed SiGe layer (other embodiments include a strained-SiGe layer). The silicon layer 220 can be epitaxially grown on the substrate 210, and provides a surface channel for the MOSFET 200. The source and drain contacts 240, 250 can be formed by reacting a metal layer with portions of the substrate 210 and the silicon layer 220. The source 245 and the drain 255 can be formed by diffusing a dopant into the substrate 210 silicon layer 220. The source and drain contacts 240, 250 can be formed by depositing a metal layer and reacting the metal layer with a portion of the substrate 210, including, at least, portions of the silicon layer 220 and the relaxed SiGe layer.

Figure 3:
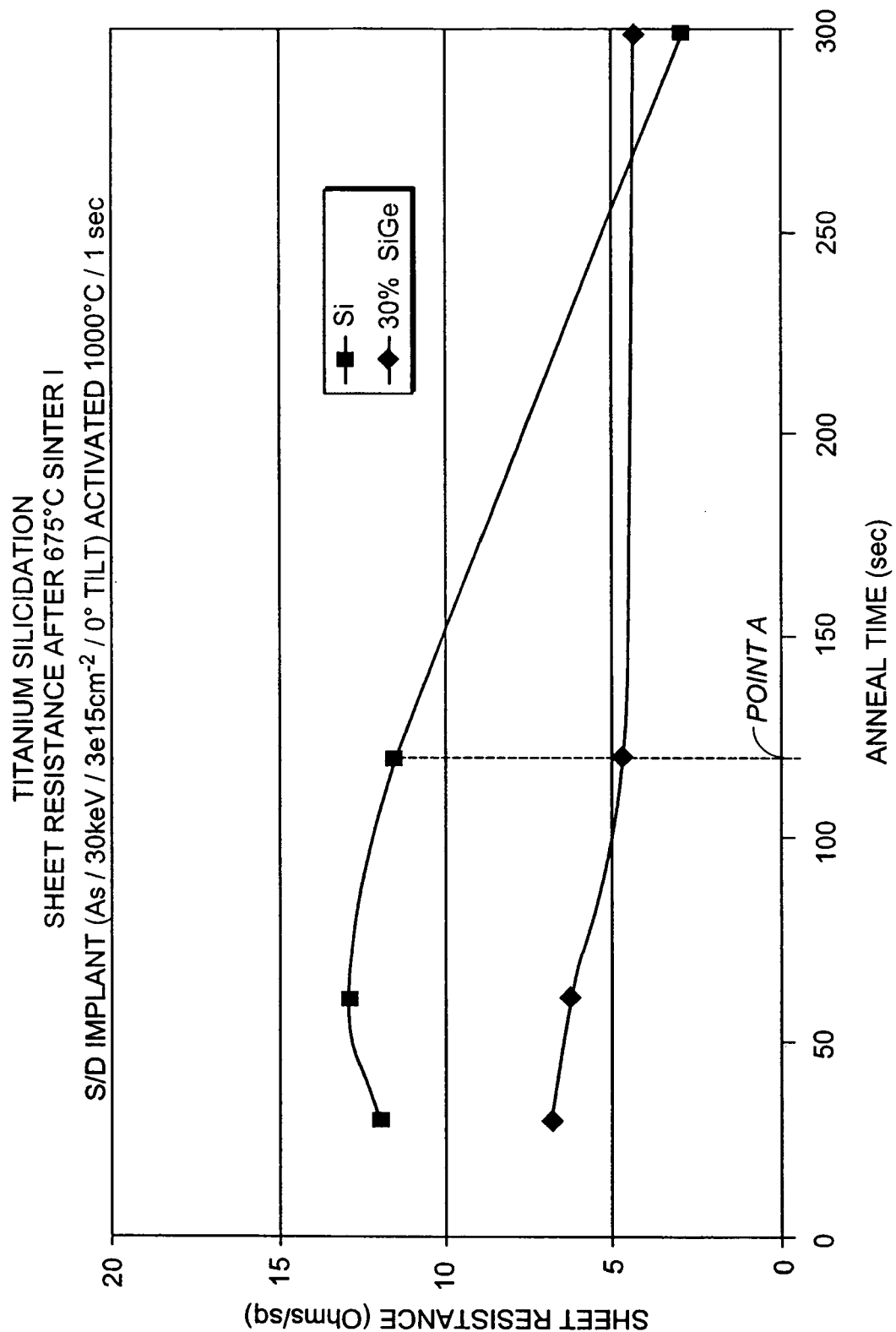
FIG. 3 is a graph of sheet resistance versus anneal time.
Figure 4:
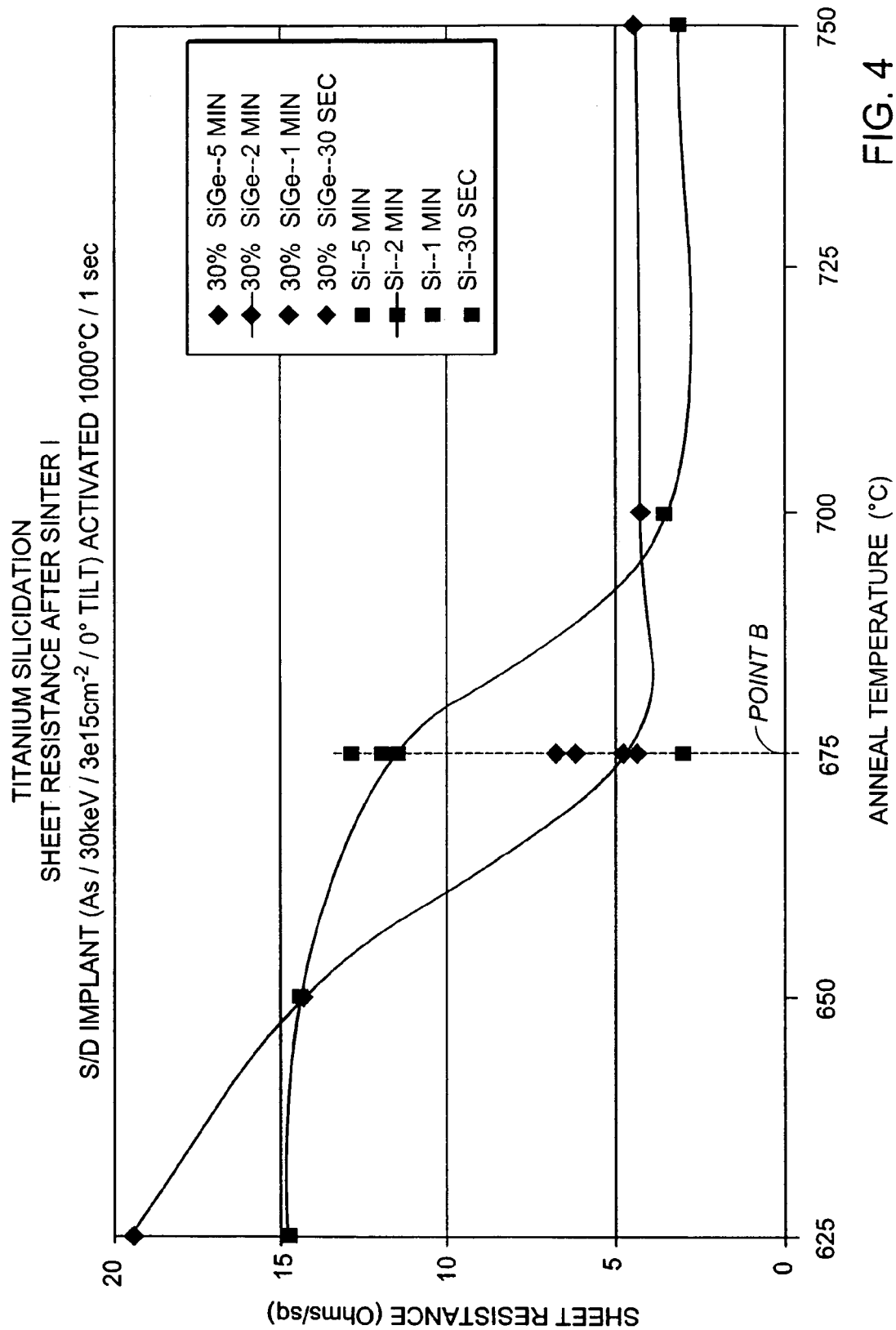
FIG. 4 is a graph of sheet resistance versus anneal temperature.

Referring now to FIGS. 3 and 4, silicidation of silicon and SiGe are compared. Conventional processing methods would typically decouple the formation of the source and drain contacts 240, 250 and the formation of the distal (upper) gate silicide portion 122 due to the differing silicidation behavior of SiGe in the substrate 210 and the polysilicon in the gate contact with a metal layer. As described below, with reference to FIGS. 3 and 4, the silicide formation rate of silicon can be very different from the silicide formation rate of SiGe. While FIGS. 3 and 4 demonstrate differences in silicidation behavior between Si and SiGe after a single annealing step, it should be noted that silicidation processes can utilize multiple annealing steps, oftentimes with unreacted metal being stripped between anneals.

FIG. 3 is a graph showing two curves of the sheet resistance vs. anneal time for samples having a titanium metal layer on Si and on $Si_{0.7}Ge_{0.3}$ during reaction at 675° C. Point A indicates a typically desired interval of anneal time, between 100–150 seconds. At this time, the sheet resistance of the Si sample is more twice that of the $Si_{0.7}Ge_{0.3}$ sample. The sheet resistance of the Si sample eventually drops below that of the $Si_{0.7}Ge_{0.3}$ sample after more than 4 minutes of annealing. This time variable annealing behavior arises from the differing reaction rates for silicide formation for Ti with Si and with SiGe.

FIG. 4 shows a graph of the sheet resistance vs. anneal temperature for samples of the same material combinations as those in FIG. 3. The graph shows data taken at various time intervals, from 30 seconds to 5 minutes. Curves are shown for the sheet resistance vs. temperature after 2 minutes of reaction time.

Point B indicates a desirable anneal temperature of 675° C. The sheet resistance of the reacted Si sample is more twice that of the reacted $Si_{0.7}Ge_{0.3}$ sample for anneal times of approximately 2 minutes or less, again demonstrating the difference in the silicidation rates of Si and SiGe for desirable combinations of annealing time and temperature.

One method for overcoming the differences in silicidation rates of gate and source-drain regions is to decouple the gate silicide formation from the source-drain silicidation, as described in U.S. Pat. No. 4,755,478. The decoupled process for siliciding the source-drain regions and gate electrode regions of a SiGe substrate typically requires more processing steps due to separation of silicidation of polysilicon in a gate contact and silicidation of the source-drain contacts, each set of steps having different optimized conditions. Decoupling tends to increase the costs of the overall silicidation process.

The silicidation of Si can occur at a much higher temperature than silicidation of SiGe. Therefore, an optimized silicidation process involving a polysilicon gate can make the SiGe substrate layer vulnerable to, for example, interdiffusion, dislocation redistribution and silicide agglomeration. Features of the invention can remove a need for decoupling, and provide gate contacts and source/drain contacts with similar, optimized processing conditions. The invention can further provide processing at lower temperatures.

Figure 5:
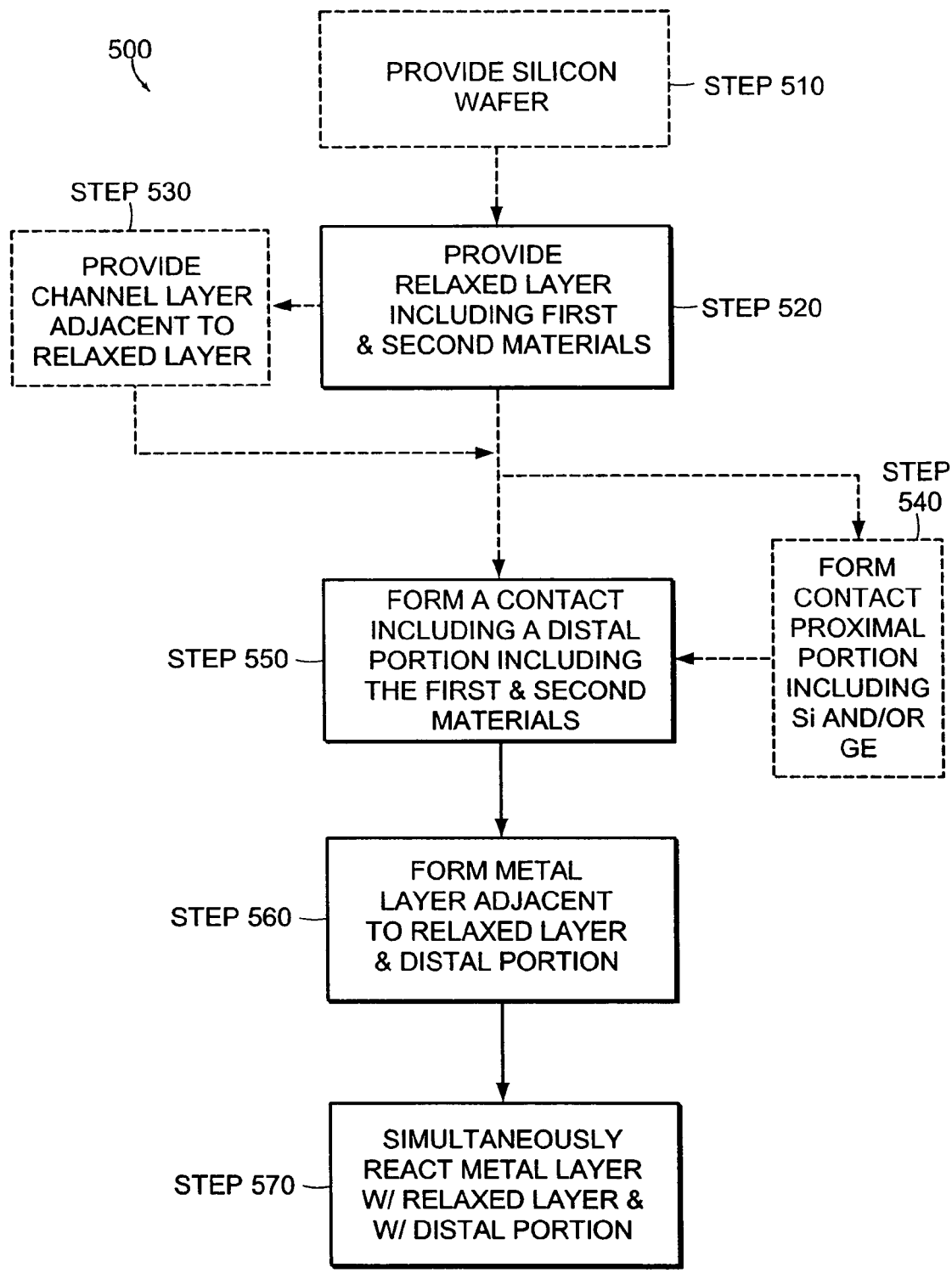
FIG. 5 is a flowchart of an embodiment of a method of fabricating a semiconductor device.

FIG. 5 is a flow diagram of an embodiment of a method 500 for fabricating a semiconductor device, according to principles of the invention. Fabrication can begin with provision of a silicon wafer (Step 510). A relaxed layer is provided (Step 520), and includes first and second materials, for example, silicon and germanium. For example, a substrate that includes a relaxed layer of SiGe, intermediate layers of SiGe and a silicon wafer can be provided; see, e.g., commonly assigned U.S. Pat. No. 6,107,653 to Fitzgerald.

A channel layer, for example, of silicon, can be provided adjacent to the relaxed layer (Step 530). For example, a surface channel silicon layer can be epitaxially grown on a SiGe relaxed layer. In some embodiments, a buried channel layer is provided adjacent to the relaxed layer. Some of these embodiments include one or more buried channel layers and a surface channel layer. The channel layers can include, for example Si, Ge or SiGe. The composition of a channel layer can be chosen in cooperation with the composition of a relaxed layer to provide a desired level of strain in the channel layer, as is conventional in the art.

The method 500 further includes formation of a contact adjacent to the relaxed layer (Step 550). The contact includes a portion that is proximal to the relaxed semiconductor layer and a portion that is distal to the relaxed semiconductor layer, i.e., lower and upper portions. The distal portion includes the first material and the second material, and preferably has substantially the same composition as the relaxed semiconductor layer. Similar compositions, for example, of SiGe, in the relaxed layer and in the upper portion of the contact enable similar optimized processing conditions for reaction of a metal layer with the relaxed layer and with the upper portion of the contact. Thus, reaction of a metal layer can proceed simultaneously for the substrate and for the contact.

Formation of the contact can commence with formation of a lower portion that includes Si, Ge or SiGe (Step 540). The distal portion can then be formed from SiGe having a different composition than the semiconductor of the proximal portion. The composition can vary abruptly or smoothly with position in the contact through the proximal and the distal portions. Thus, the composition of the proximal portion can be chosen, for example, for its electrical performance or compatibility with an adjacent gate dielectric, as described in below. The composition of the distal portion, in contrast, can be chosen to provide compatibility with the composition of the relaxed layer.

The method 500 further includes formation of a metal layer adjacent to the relaxed semiconductor layer and the distal portion of the contact (Step 560). The metal can include, for example, titanium, cobalt, nickel, platinum, molybdenum, tungsten and/or zirconium. The metal layer is simultaneously reacted with the substrate and with the distal portion of the contact (Step 570). In preferred embodiments, most of the metal layer that reacts with the substrate will react with the relaxed semiconductor layer, in part because any surface layers will be relatively thin. Thus, in these embodiments, the relaxed layer will dominate over other portions of the substrate in the reaction with the metal layer.

In the case of a substrate that includes a SiGe relaxed semiconductor layer, the above-described method permits the formation of source and drain silicide contacts in a substrate at the same time as formation of a distal germanium silicide portion of a gate contact. Both gate silicide and source and drain silicide can be formed under preferred time and temperature annealing conditions. Thus, rather than decoupling the formation of a conductive cap for the gate contact and formation of source and drain contacts, the invention facilitates simultaneous processing.

Various preferred embodiments of the invention utilize a substrate that includes a SiGe layer. The SiGe layer can be grown on a silicon wafer, and can include more than one layer of alloys of varying composition, thickness and growth conditions. Thus, the substrate can include a SiGe layer or multiple SiGe layers and/or SiGe layers having graded composition. In some embodiments, the SiGe layer includes a relaxed SiGe layer grown on intermediate SiGe layers that accommodate the lattice mismatch with a silicon wafer.

The substrate can include, for example, a silicon wafer, with the SiGe layers grown on the silicon wafer. In this case, an oxide layer can be present between the silicon wafer and the SiGe layer. Other types of wafers can be used as a base for a substrate, e.g., silicon-on-insulator (SOI) wafers, germanium wafers, glass substrates and laminated substrates.

A channel layer can be a surface or a buried layer, and can be formed, for example, from silicon, germanium or a combination of silicon and germanium. For example, a buried channel layer can be a strained silicon layer epitaxially grown on a relaxed SiGe layer. Alternatively, the buried layer, can be germanium or can be SiGe having a composition that is different from the SiGe of the relaxed layer.

For example, the buried channel layer can have a composition of $Si_{1-x}Ge_x$ while the relaxed layer has a composition of $Si_{1-y}Ge_y$. For x>y, the buried SiGe layer is under compressive stress, and thus exhibits a compressive strain.

Thus, material combinations can be chosen to provide a p-channel MOSFET, preferably by provding a compressively strained SiGe buried layer, or an n-channel MOSFET, preferable by providing a tensilely strained silicon layer.

Some preferred embodiments of the invention use relaxed SiGe layers grown on silicon substrates. Silicon, germanium and SiGe layers can be grown via known epitaxial growth techniques. Growth of a buried layer of silicon, germanium or SiGe on a SiGe relaxed layer, or SiGe on silicon, enables production of buried layers of controlled stress and dislocation density. Examples of SiGe substrates, in which the Ge content can be up to 100%, include: a relaxed, uniform composition SiGe layer on a graded composition SiGe layer atop a Si substrate; a relaxed, uniform composition SiGe layer directly adjacent to a Si substrate; and a relaxed, uniform composition SiGe layer on an insulating layer like $SiO_2$, adjacent a Si substrate.

Figure 6:
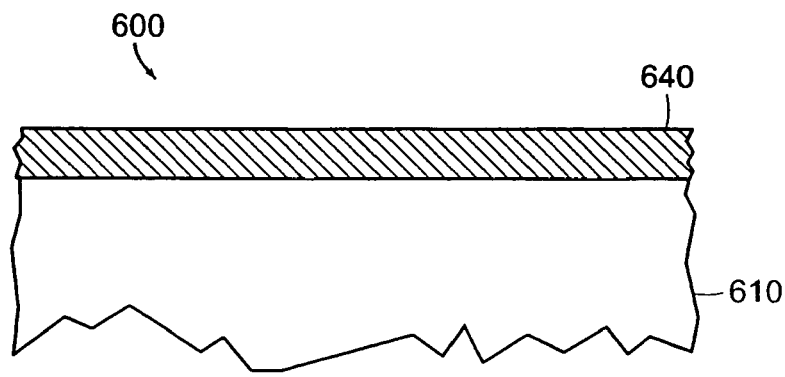
FIG. 6 is a cross-sectional view of an embodiment of a substrate used for fabrication of an embodiment of a MOSFET.
Figure 7A:
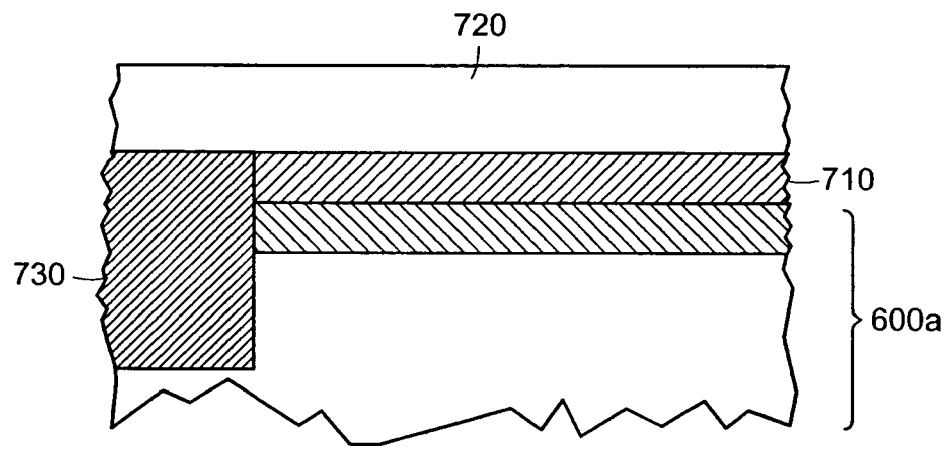
FIGS. 7A and 7B are cross-sectional views of structures at intermediate steps during fabrication of an embodiment of a MOSFET, utilizing the substrate of FIG. 6.
Figure 7B:
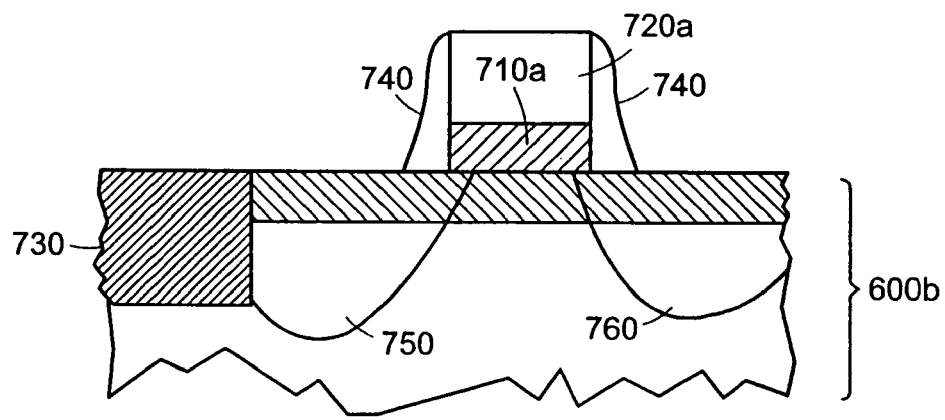
Figure 8A:
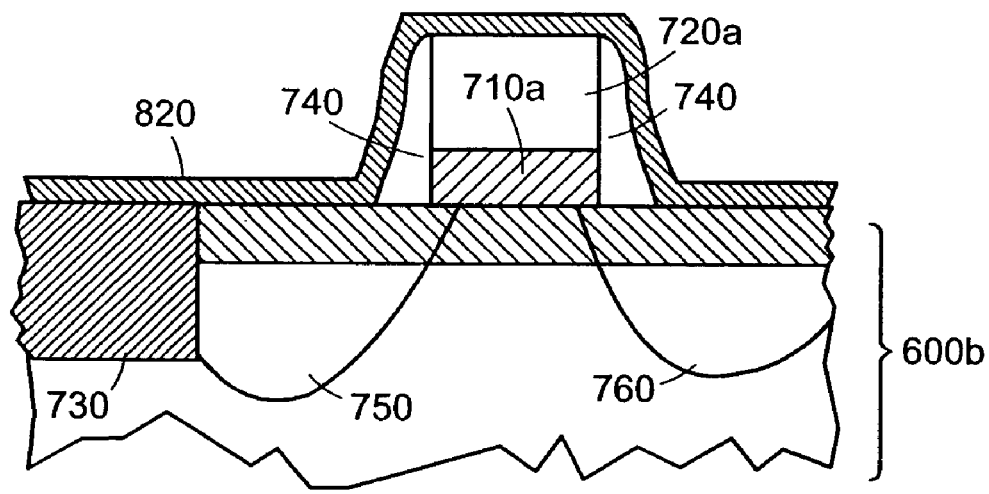
FIGS. 8A and 8B are cross-sectional views of structures at fabrication steps that follow the steps illustrated in FIGS. 7A and 7B.
Figure 8B:
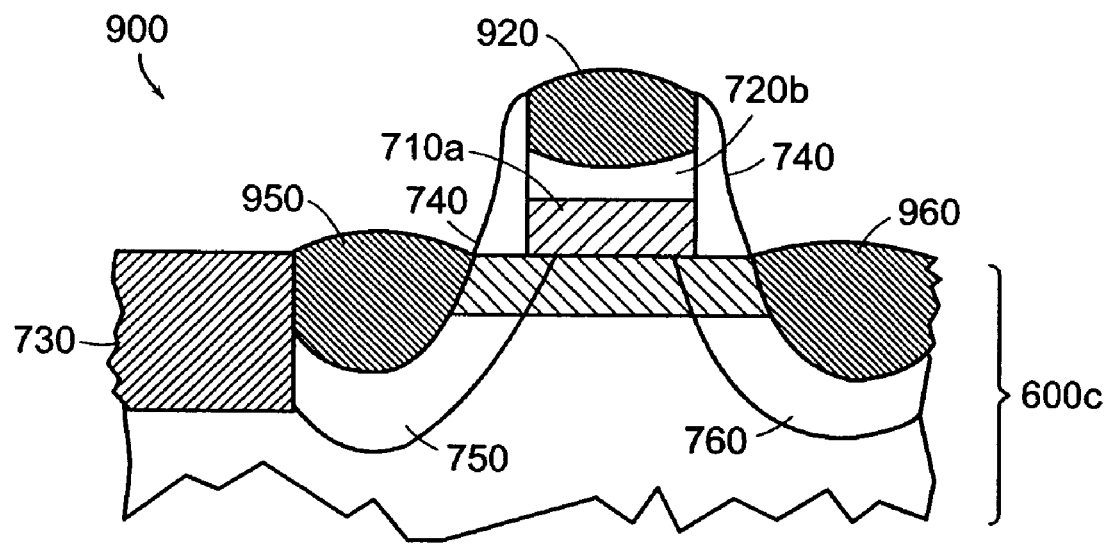

Referring now to FIGS. 6–8, steps in an embodiment of a MOSFET fabrication process, and some preferred device structures, are described. FIGS. 6–8 are chronologically arranged cross-sectional views of MOSFET-related structures at various stages of an embodiment of a MOSFET fabrication process. The completed embodiment of a MOSFET 900 is shown in FIG. 8B.

FIG. 6 illustrates an embodiment of a substrate 600 used as a base for fabrication of the embodiment of the MOSFET 900. The substrate 600 includes a relaxed SiGe layer 610 and a strained Si surface layer 640. The substrate 600 can provide a base for the fabrication of semiconductor devices, such as transistors. The substrate 600 can be manufactured via epitaxial growth and polishing techniques, as described in commonly assigned U.S. Pat. No. 6,107,653 to Fitzgerald.

It will be appreciated by those skilled in the art that the relaxed SiGe substrate layer 610 can form the base substrate of many types of MOSFET devices. The thin strained Si layer 640 can alternatively be a SiGe layer, a sequence of Si and SiGe layers, or other combination of thin epitaxial layers, as described above.

FIGS. 7A–B illustrate some fabrication steps of a gate contact for the MOSFET 900. FIG. 7A shows a cross-sectional view of a device at a stage of fabrication, chronologically following the stage of FIG. 6. At this stage, regions of isolation portions 730 have been formed in the substrate 600 to provide a modified substrate 600a. A dielectric layer 710 and a polycrystalline semiconductor layer 720 have been formed on the substrate 600a. The polycrystalline semiconductor layer 720 can include silicon and germanium.

The isolation portion 730 preferably is deep enough to cross all channel layers of semiconductor material in the substrate 600a, ending at least in the SiGe relaxed layer of the substrate 600a. In other embodiments, the isolation portions 730 are absent or replaced by other isolation means. For example, one embodiment includes semi-recessed oxide isolation (S-ROX) portions. Generally, a relatively high degree of planarity is preferably maintained between the upper surface of the substrate 600a and the upper surface of the isolation portions 730.

The dielectric layer 710, which provides a gate dielectric, is formed on the exposed surface of the substrate 600, possibly consuming a portion of the surface of the strained-silicon layer 640. The dielectric layer 710 can be formed by various methods conventional in the art, e.g., via thermal oxidation of the surface of the substrate 600 or via a deposition technique.

The dielectric layer 710 can be, for example, a 15–100 Å (1.5–10.0 nm) thick layer of silicon dioxide. Other embodiments include other suitable dielectric materials, e.g., silicon oxynitride, silicon nitride, a plurality of silicon nitride and silicon oxide layers, or a high-k dielectric.

A polycrystalline semiconductor layer 720 is then deposited on the dielectric layer 710, e.g., via chemical-vapor deposition. The polycrystalline semiconductor layer 720 can be, for example, 1000 Å (100 nm) thick.

The polycrystalline semiconductor layer 720 preferably has an upper portion including SiGe with a Ge content substantially identical to the Ge content of the relaxed SiGe layer 610. In some embodiments, a proximal (lower) portion of the layer 720 has a different composition from that of the distal (upper) portion of the layer 720. Thus, the composition of the distal portion can be matched to the substrate layer 610, while the portion in contact with the dielectric layer 710 can have a composition chosen, for example, for its compatibility with the dielectric material. For example, polycrystalline silicon is highly compatible with silicon dioxide dielectric, the interface between these two materials has a relatively very low electrical defect density.

FIG. 7B illustrates another stage in the production of the MOSFET 900, related to some steps in the formation of a gate contact. The dielectric layer 710 and the polycrystalline semiconductor layer 720 have been patterned to respectively form a gate dielectric 710a and a gate contact semiconductor portion 720a. The patterning can be performed via methods conventional in the art, e.g., via photolithography and sputter etching.

Contact sidewall spacers 740 have been formed prior to formation of a source region 750, and a drain region 760. The sidewall spacers 740 can provide isolation between the gate contact and source/drain regions 750, 760, and facilitate fabrication of self-aligned structures. The spacers 740 can be formed via methods conventional in the art, e.g., via oxide deposition, thermal oxidation of polysilicon and/or nitride deposition.

The source region 750 and the drain region 760 include dopant, which extends across the interface between the silicon surface layer 640 and the SiGe relaxed layer in the further modified substrate 600b.

For one embodiment of the MOSFET 900, the structures illustrated in FIG. 7B are fabricated as follows. A layer of photosensitive polymer (e.g., a Novolak-based photoresist, as known to one having ordinary skill in the semiconductor lithography arts) is coated on a polycrystalline-SiGe semiconductor layer 720. The polymer is exposed and developed to define a photo-mask having substantially vertical sidewalls. The exposed portions of SiGe semiconductor layer 720 are sequentially etched in a directional mode to define the gate contact semiconductor portion 720a. The photo-mask is removed, e.g., via an $O_2$ plasma etch.

The sidewall spacers 740 are formed on the exposed sides of the gate contact semiconductor portion 720a. The sidewall spacers 740 can be formed using one of several known methods. A preferred method is to deposit a layer of chemically vapor-deposited (CVD) oxide over the entire structure, and directionally etch the deposited layer so that it is removed from the horizontal surfaces of the substrate. During this removal step, exposed portions of the underlying dielectric layer 710 are also removed to define the gate dielectric 710a.

After the sidewall spacers 740 are formed, the source region 750 and the drain region 760 are defined, for example, through ion implantation and drive-in anneal. The diffusion regions can be formed using one of several techniques. For example, implantation of dopant ions to define the diffusion regions can use the gate contact and isolation regions 730 as an implantation mask.

FIGS. 8A–B illustrate aspects of silicide formation for the MOSFET 900. FIG. 8A illustrates deposition of a metal layer 820 on the structures illustrated in FIG. 7B. The metal layer 820 is formed during a single deposition step, and is adjacent to portions of both the substrate 600*b* and the gate contact semiconductor portion 720*a*. The metal layer 820 preferably is approximately 8–20 nanometers (nm) in thickness.

FIG. 8B is a cross-sectional view of the completed embodiment of the MOSFET 900. Upon annealing of the structures shown in FIG. 8A, and removal of residual portions of the metal layer 820, self-aligned gate and source-drain silicide contacts are formed, as described below; the MOSFET 900 includes a gate contact silicide 920, source contact silicide 950 and a drain contact silicide 960.

The gate contact silicide 920, forms from reaction of a portion of the metal layer 820 with SiGe in the gate contact semiconductor portion 720*a*. The source and drain contacts 950, 960 form from reaction of a portion of the metal layer 820 with Si and SiGe in the substrate 600*b*, thus leaving a further modified substrate 600*c*. The metal layer 820 reacts with SiGe having similar or identical compositions in both the gate contact and in the substrate 600*b*, providing common silicidation behavior and silicide formation in a single step.

After reaction of the metal layer 820 with neighboring material, an unreacted gate semiconductor portion 720*b* can remain in the contact. Some metals that can be used in the metal layer 820 are described in the following:

Titanium—can provide a good silicide on SiGe, but generally not well suited to short gate length polysilicon gates.

Cobalt—generally preferable relative to Ti for sub-quarter micrometer linewidths, but can lead to agglomeration problems in conjunction with SiGe having a Ge atomic fraction of greater than approximately 15%.

Nickel—generally works well with SiGe, at least for Ge atomic compositions of up to 45–50% or more, and consumes less silicon during silicidation than some other metals.

Platinum—generally works well with SiGe, at least for Ge atomic compositions of up to 45–50% or more.

Zirconium—can be used with SiGe.

Multilayered metals—stacked metal layers (e.g., Pt/Ni) can be used.

Alloys—can be used (e.g., NiPt).

In one embodiment of the MOSFET 900, the gate contact semiconductor portion 720*a* includes SiGe with a graded composition. In this embodiment, a distal portion of the gate contact semiconductor portion 720*a* has a composition that matches the relaxed SiGe layer 610, and a proximal portion, adjacent to the gate dielectric 710*a*, that has a greater Ge content. The greater Ge content can be substantially pure Ge. This embodiment provides single-step silicidation of source, drain and gate with the further advantage of an improved work function due to the elevated Ge content at the interface with the gate dielectric 710*a*.

In another embodiment, a proximal portion of the gate contact semiconductor portion 720*a* is substantially pure silicon. This embodiment provides single-step silicidation of source, drain and gate, as well as a high quality gate contact/gate oxide interface, for example when the gate oxide 710*a* is a silicon dioxide. It can also provide, for example, a gate contact work function that is similar/identical to conventional MOSFETS.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

What is claimed is:

1. A method for forming a semiconductor device, the method comprising:
   providing a substrate;
   forming a gate dielectric layer over a portion of the substrate, thereby defining a channel below the gate dielectric layer;
   forming a source contact and a drain contact proximate the channel by depositing a metallic material and performing an annealing step, each of the source contact and drain contact comprising a reacted conductive silicide layer, the reacted conductive silicide layer comprising silicon, germanium, and the metallic material; and
   forming a gate contact over at least a portion of the gate dielectric layer by depositing the metallic material and performing an annealing step, the gate contact including a reacted conductive silicide portion comprising a semiconductor material and the metallic material,
   wherein the channel of the semiconductor device is strained.

2. The method of claim 1, wherein the reacted conductive silicide layer of at least one of the source contact and drain contact is formed proximate a material comprising SiGe.

3. The method of claim 2, further comprising defining an isolation region proximate the material comprising SiGe.

4. The method of claim 2, wherein the SiGe is at least partially relaxed.

5. The method of claim 1, wherein the reacted conductive silicide portion of the gate contact comprises germanium.

6. The method of claim 1, wherein the gate contact comprises an unreacted semiconductor portion.

7. The method of claim 6, wherein the unreacted semiconductor portion consists essentially of polycrystalline silicon.

8. The method of claim 6, wherein the unreacted semiconductor portion comprises germanium.

9. The method of claim 1, further comprising forming a strain-inducing material over at least a portion of the substrate, the strain-inducing material comprising silicon, wherein strain in the strained channel is induced by the strain-inducing material.

10. The method of claim 9, wherein forming the strain-inducing material comprises epitaxial growth.

11. The method of claim 9, further comprising defining an isolation region, wherein the isolation region is disposed proximate the strain-inducing material.

12. The method of claim 1, further comprising forming a strain-inducing material over at least a portion of the substrate, the strain-inducing material comprising germanium, wherein strain in the strained channel is induced by the strain-inducing material.

13. The method of claim 12, wherein forming the strain-inducing material comprises epitaxial growth.

14. The method of claim 12, further comprising defining an isolation region, wherein the isolation region is disposed proximate the strain-inducing material.

15. The method of claim 12, wherein the strain-inducing material is at least partially relaxed.

16. The method of claim 1, wherein the metallic material comprises at least one of nickel, platinum, and zirconium.

17. The method of claim 1, wherein the strained channel comprises at least one of silicon and germanium.

18. The method of claim 1, wherein the strained channel is disposed proximate a material comprising SiGe.

19. The method of claim 1, wherein the strained channel is tensilely strained.

20. The method of claim 1, wherein the strained channel is compressively strained.

21. The method of claim 1, wherein the gate dielectric layer comprises at least one of silicon oxynitride and a high-k dielectric.

22. The method of claim 1, wherein forming the gate dielectric layer comprises at least one of oxidation and deposition.

23. The method of claim 1, wherein the strained channel is disposed over an insulator layer.

24. The method of claim 1, wherein the strained channel is disposed over a relaxed material.

25. The method of claim 16, wherein the metallic material comprises nickel.

26. The method of claim 25, wherein the metallic material consists essentially of nickel.

27. The method of claim 26, wherein the strained channel comprises silicon.

28. The method of claim 27, wherein the strained channel is compressively strained.

29. The method of claim 27, wherein the strained channel consists essentially of silicon.

30. The method of claim 29, wherein the strained channel is compressively strained.

31. The method of claim 29, further comprising forming a strain-inducing material over at least a portion of the substrate, the strain-inducing material consisting essentially of SiGe, wherein strain in the strained channel is induced by the strain-inducing material.

32. The method of claim 31, wherein the strain-inducing material is disposed proximate the reacted conductive silicide layer and the strained channel.

33. The method of claim 32, wherein forming the strain-inducing material comprises epitaxial growth.

34. The method of claim 33, wherein the substrate consists essentially of one or more semiconductor materials.

35. The method of claim 34, wherein the substrate consists essentially of silicon.

36. The method of claim 35, further comprising defining an isolation region, wherein the strain-inducing material is disposed proximate the isolation region.

37. The method of claim 36, wherein the semiconductor device is a p-channel MOSFET.

38. The method of claim 37, wherein the strained channel is compressively strained.

39. The method of claim 33, wherein the strained channel is disposed over an insulator layer.

40. The method of claim 39, further comprising defining an isolation region, wherein the strain-inducing material is disposed proximate the isolation region.

41. The method of claim 40, wherein the semiconductor device is a p-channel MOSFET.

42. The method of claim 41, wherein the strained channel is compressively strained.

* * * * *